US006897564B2

(12) United States Patent
Kim et al.

(10) Patent No.: US 6,897,564 B2
(45) Date of Patent: May 24, 2005

(54) PLASMA DISPLAY PANEL HAVING TRENCH DISCHARGE CELLS WITH ONE OR MORE ELECTRODES FORMED THEREIN AND EXTENDED TO OUTSIDE OF THE TRENCH

(75) Inventors: Dae-Il Kim, Riverdale, NJ (US); William Kokonaski, Gig Harbor, WA (US)

(73) Assignee: Plasmion Displays, LLC., Roanoke, VA (US)

( * ) Notice: Subject to any disclaimer, the term of this patent is extended or adjusted under 35 U.S.C. 154(b) by 35 days.

(21) Appl. No.: 10/241,839

(22) Filed: Sep. 12, 2002

(65) Prior Publication Data

US 2003/0134506 A1 Jul. 17, 2003

Related U.S. Application Data

(60) Provisional application No. 60/347,292, filed on Jan. 14, 2002, provisional application No. 60/383,604, filed on May 29, 2002, provisional application No. 60/398,112, filed on Jul. 25, 2002, and provisional application No. 60/409,277, filed on Sep. 6, 2002.

(51) Int. Cl.[7] ........................... H01L 29/41; H01J 17/49

(52) U.S. Cl. ....................... 257/774; 438/609; 313/582; 345/71

(58) Field of Search ................... 257/81, 774; 313/582; 345/60, 67, 68, 71; 438/149, 609

(56) References Cited

U.S. PATENT DOCUMENTS

| | | | |
|---|---|---|---|
| 3,619,698 | A | 11/1971 | Caras |
| 3,662,214 | A | 5/1972 | Lustig |
| 3,700,946 | A | 10/1972 | Caras |
| 3,701,918 | A | 10/1972 | Allen et al. |

(Continued)

FOREIGN PATENT DOCUMENTS

| | | |
|---|---|---|
| EP | 0021371 | 1/1981 |
| JP | 2000-171827 | 6/2000 |
| KR | 10-2001-0039312 | 5/2001 |
| WO | WO 00/70643 | 11/2000 |

OTHER PUBLICATIONS

"Semiconductor Integrated Display with Anodized Light Barrier," IBM Technical Disclosure Bulletin, May 1983, pp. 6371–6372.

"Semiconductor Integrated Display," IBM Technical Disclosure Bulletin, May 1987, pp. 5463–5464.

"Microhollow Electrode Discharge Flat Panel Displays," Plasma Science, IEEE Conference Record—Abstracts, IEEE International Conference, 1997, p. 315, K.H. Schoenbach et al.

"The Characteristics of Plasma Display with the Cylindrical Hollow Cathode," IEEE Transactions On Electron Devices, vol. 46, No. 12, Dec. 1999, pp. 2344–2347, K.C. Choi et al.

*Primary Examiner*—Stephen W. Smoot
(74) *Attorney, Agent, or Firm*—Morgan, Lewis & Bockius LLP

(57) ABSTRACT

A plasma display panel having a trench discharge cell and a method of fabricating the same are disclosed in the present invention. The plasma display panel having a plurality of trench discharge cells includes a transparent substrate having at least one isolated trench in a discharge cell, one or more sustain electrodes in each trench and extended to outside of the trench, one or more bus electrodes on the sustain electrode, and a dielectric layer formed on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, and wherein the trench has a first length perpendicular to a direction of the sustain electrodes and a second length parallel to a direction of the sustain electrodes and the first length is greater than the second length.

120 Claims, 32 Drawing Sheets

U.S. PATENT DOCUMENTS 3,743,879 A 7/1973 Kupsky
3,777,206 A 12/1973 Armstrong
4,392,075 A 7/1983 Kamegaya et al.
5,144,200 A 9/1992 Kim
5,214,521 A 5/1993 Kwon et al.
5,311,204 A 5/1994 Nishida
5,319,279 A 6/1994 Watanabe et al.
5,440,201 A 8/1995 Martin et al.
5,483,118 A 1/1996 Nakamoto et al.
5,696,569 A 12/1997 Bongaerts et al.
5,705,886 A 1/1998 Bongaerts et al.
5,744,909 A * 4/1998 Amano ....................... 313/585
5,808,408 A 9/1998 Nakamoto
5,852,347 A 12/1998 Marcotte
5,868,811 A 2/1999 Khan et al.
5,898,271 A 4/1999 Mehrotra et al.
5,957,743 A * 9/1999 Konishi et al. ............... 445/24
5,998,935 A 12/1999 Marcotte
6,005,345 A * 12/1999 Choi et al. .................. 313/582
6,007,399 A 12/1999 Mehrotra et al.
6,097,464 A 8/2000 Liu
6,114,748 A 9/2000 Nagano et al. ............ 257/632
6,118,214 A 9/2000 Marcotte
6,252,353 B1 6/2001 Ha et al.
6,281,621 B1 8/2001 Nakamoto et al.
6,337,538 B1 1/2002 Awaji et al.
6,339,292 B1 1/2002 Ha
6,348,762 B1 2/2002 Nunomura et al. ......... 313/582
6,407,509 B1 * 6/2002 Ikeda et al. .............. 315/169.4
6,605,897 B1 * 8/2003 Yoo ........................... 313/582
2001/0006326 A1 * 7/2001 Shirozu ...................... 313/582
2001/0048275 A1 12/2001 Nakada et al. .............. 315/160
2001/0052753 A1 12/2001 Jo ............................. 313/582
2002/0008472 A1 * 1/2002 Ha ............................. 313/582

* cited by examiner

PLASMA DISPLAY PANEL HAVING TRENCH DISCHARGE CELLS WITH ONE OR MORE ELECTRODES FORMED THEREIN AND EXTENDED TO OUTSIDE OF THE TRENCH

This application claims the benefit of four provisional applications: "Plasma Display Panel Having Three-Dimensional Electrode Structure," which was filed on Jan. 14, 2002 and assigned Provisional Application No. 60/347,292; "Trench Cells for Plasma Display Panel," which was filed on May 29, 2002 and assigned Provisional Application No. 60/383,604; "Trench Cells for Plasma Display Panel," which was filed on Jul. 25, 2002 and assigned Provisional Application No. 60/398,112; and "Capillary Discharge Plasma," which was filed on Sep. 6, 2002 and assigned Provisional Application No. 60/409,277, all of which are hereby incorporated by reference.

BACKGROUND OF THE INVENTION

1. Field of the Invention

The present invention relates to a plasma display panel, and more particularly, to a plasma display panel having a trench discharge cell and a method of fabricating the same. Although the present invention is suitable for a wide scope of applications, it is particularly suitable for improving luminescent efficiency and reducing driving voltage in plasma display panels.

2. Discussion of the Related Art

Plasma display panels (PDP's) are comprised of a large number of plasma cells that generate ultraviolet light. The UV light is then converted into visible display emission by a phosphor layer. The brightness and efficiency of the display are mainly dependent on the intensity and efficiency of the production of the UV light by the plasma cell.

A conventional structure of an AC type plasma display panel shown in FIG. 1. The conventional AC type plasma display panel is formed of a front substrate and a rear substrate. A space formed between the two substrates is filled with an inert gas.

The front substrate includes a first glass substrate 11, a transparent conductive layer 12 having a striped shape deposited thereon, and a bus electrode 13 generally formed of a silver paste and compensating a high resistance of a transparent dielectric layer 14. The transparent dielectric layer 14 limits the amount of current and transmits visible light discharge from a phosphor layer. A black stripe layer 15 is formed of a black insulating layer, which improves a contrast ratio. A protective layer (not shown) is formed of a magnesium oxide thin film, which is highly durable to the impact during ionic discharge and enhances discharge of the secondary electrons. A pair of electrodes, which are formed of the transparent conductive layer 12 and the bus electrode 13, is formed into one discharge cell.

The rear substrate includes a second glass substrate 16 having an address electrode 17 formed thereon, and a protective layer 18 for the address electrode, a barrier rib 19, and a phosphor layer 20 deposited thereon.

The operation of the plasma display panel having the above structure will now be described. A strong discharge occurs between the address electrodes 17 on the rear substrate and one of the electrode pairs on the front substrate. Then, an AC signal is sent to one of the electrode pairs on the front substrate in order to maintain plasma discharge. As a result of the discharge, photons with wavelengths in the ultra-violet region are emitted. The emission of the photons in the Ultra-violet region stimulates the phosphor layer 20 of the rear substrate, which emits visible light that is used to form the picture or image on the display.

In the plasma display device having the above-described structure, luminance and efficiency are the main factors that determine the quality of the device. The conventional AC type surface discharge PDP has the following disadvantages.

Due to the difference in length of the discharge paths inside the discharge cell and outside the discharge cell, the electric field cannot be uniformly generated. Therefore, a uniform discharge, whereby discharge is stronger in the inner portion of the unit discharge cell and becomes weaker as it nears the outer portion of the cell, and high luminescent efficiency resulting from the uniform discharge cannot be achieved. Furthermore, the electrodes have a structure of a two-dimensional flat surface. Thus, in accordance with a high resolution, the area of the electrode becomes smaller, the luminescent efficiency decreases, and the driving voltage increases.

SUMMARY OF THE INVENTION

Accordingly, the present invention is directed to a plasma display panel having a trench discharge cell and a method of fabricating the same that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a plasma display panel having a plurality of trench discharge cells, one or more sustain electrodes, and one or more bus electrodes, comprising a transparent substrate having at least one isolated trench in a discharge cell wherein the trench has a first length perpendicular to a direction of the sustain electrodes and a second length parallel to a direction of the sustain electrodes, and the first length in greater than the second length.

In another aspect of the present invention, a plasma display panel having a plurality of trench discharge cells, comprising a transparent substrate having at least one isolated trench in a discharge cell; one or more sustain electrodes in each trench and extended to outside of the trench; one or more bus electrodes on the sustain electrode; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, and wherein the trench has a first length perpendicular to a direction of the sustain electrodes and a second length parallel to a direction of the sustain electrodes and the first length is greater than the second length.

In another aspect of the present invention, a method of fabricating a plasma display panel includes forming at least one isolated trench in a discharge cell of a transparent substrate, forming one or more sustain electrodes in the trench and extended to outside of the trench, forming one or more bus electrodes on the sustain electrodes, and forming a dielectric layer on an entire surface of the substrate including the sustain electrodes, the bus electrodes, and the trench, wherein the dielectric layer having a first portion on the bottom of the trench, a second portion extended to outside of the trench, and a third portion on side-walls of the trench, and wherein the trench has a first length perpendicular to a direction of the sustain electrodes and a second length parallel to a direction of the sustain electrodes and the first length is greater than the second length.

In another aspect of the present invention, a method of fabricating a plasma display panel includes forming at least one groove in a transparent substrate, forming one or more sustain electrodes in the groove and extended to outside of the groove, forming one or more bus electrodes only on the extended portions of the sustain electrodes positioned outside the groove, forming a first dielectric layer on an entire surface of the substrate including the sustain electrodes, the bus electrodes, and the trench, wherein the first dielectric layer has a first portion on the bottom of the groove and a second portion outside the groove, and a third portion on side-walls of the trench, and forming a plurality of partitions in the groove to form at least one isolated trench in the transparent substrate.

In a further aspect of the present invention, a method of fabricating a plasma display panel includes forming one or more grooves in a first substrate, forming one or more sustain electrodes in the grooves and extended to an outside of the groove, forming one or more bus electrodes only on the extended portions of the sustain electrodes positioned outside the grooves, forming a first dielectric layer on an entire surface of the substrate including the sustain electrodes, the bus electrodes, and the grooves, wherein the first dielectric layer having a first portion on the bottom of the grooves, a second portion outside the grooves, and a third portion on side-walls of the grooves, forming an address electrode on a second substrate, forming a second dielectric layer on the address electrode including the second substrate, and forming a plurality of protrusions on the second substrate to form at least one isolated trench between the first and second substrates.

In another aspect of the present invention a plasma display panel having a plurality of trench discharge cells, comprising transparent substrate having at least one isolated trench in a discharge cell; one or more sustain electrodes in each trench and extended to outside of the trench; one or more bus electrodes on the sustain electrode; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, wherein the trench has a first length perpendicular to a direction of the sustain electrodes and a second length parallel to a direction of the sustain electrodes, and first length is substantially greater than the second length to generate a positive column effect in the discharge cell.

In yet another aspect of the present invention, a plasma display panel having a plurality of trench discharge cells, comprising a transparent substrate having at least one isolated trench in a discharge cell; one or more sustain electrodes in each trench and extended to outside of the trench; one or more bus electrodes on the sustain electrode; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, wherein the first portion has a thickness greater than the second and third portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
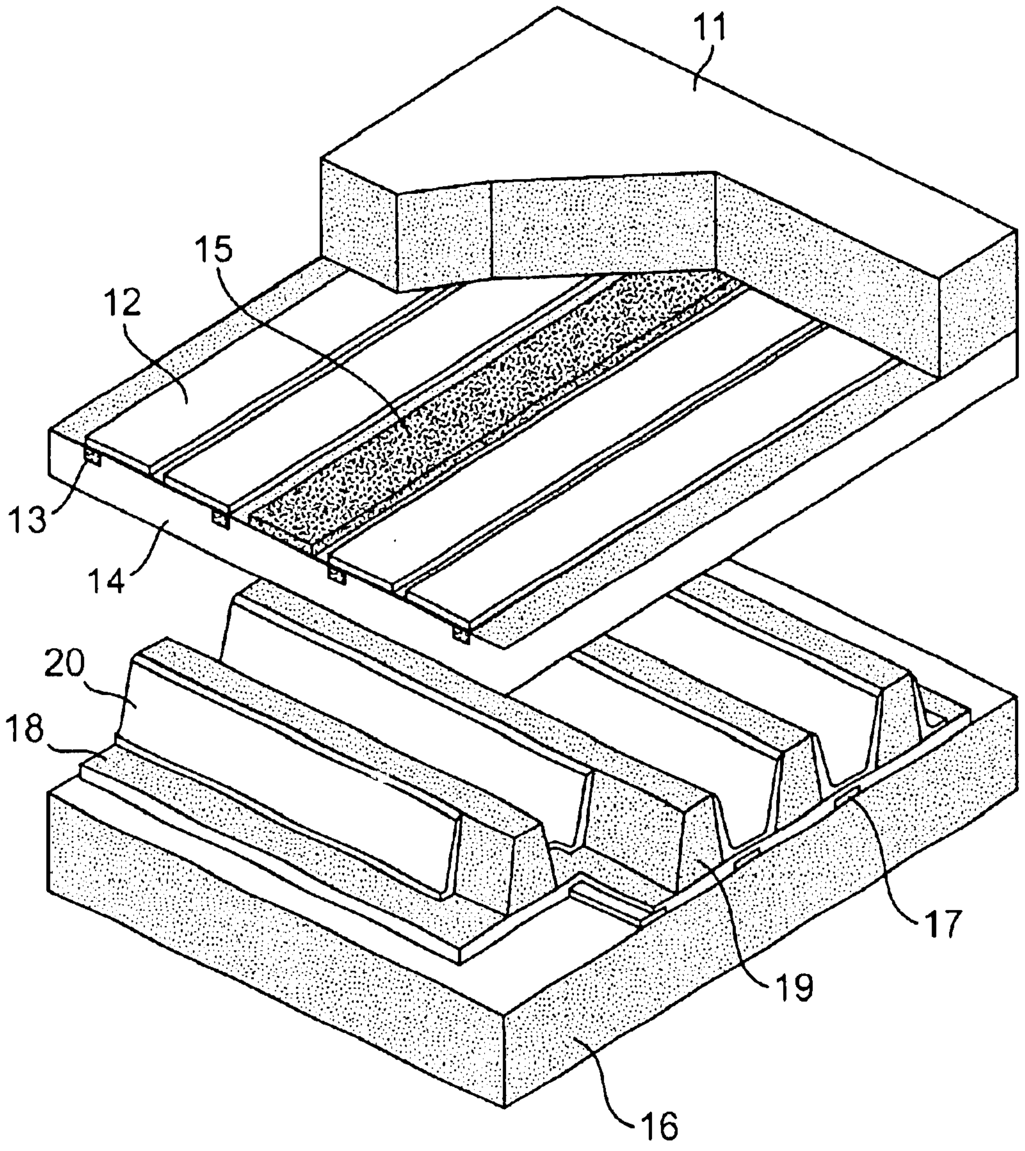
FIG. 1 RELATED ART
FIG. 1 is an expanded perspective view illustrating a conventional AC type plasma display panel.
Figure 2A:
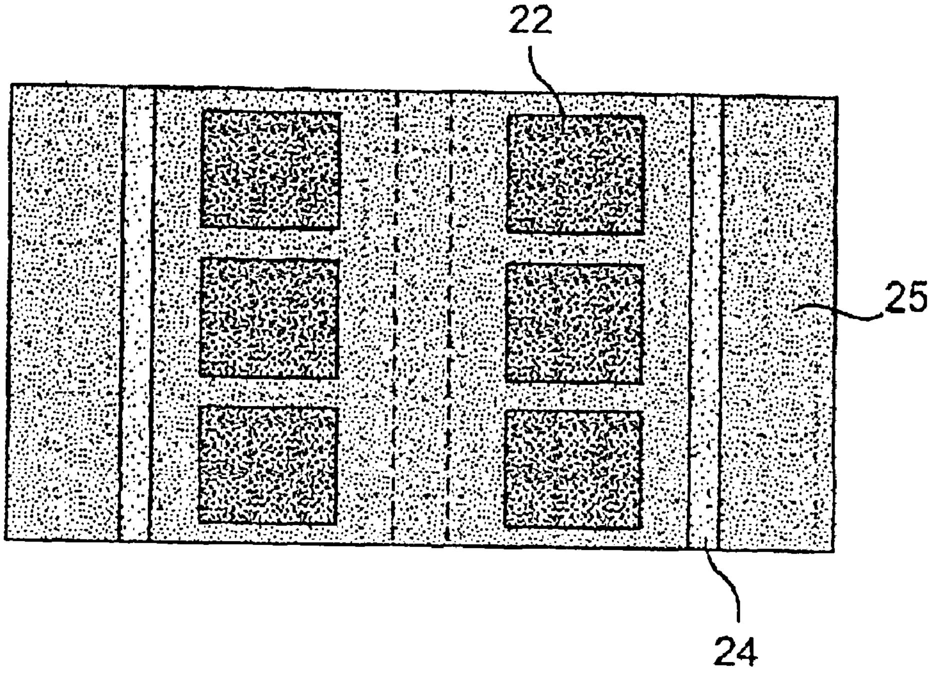
FIGS. 2A and 2B illustrate a schematic plane view and a cross-sectional view of a unit discharge cell for a plasma display panel according to a first embodiment of the present invention.
Figure 2B:
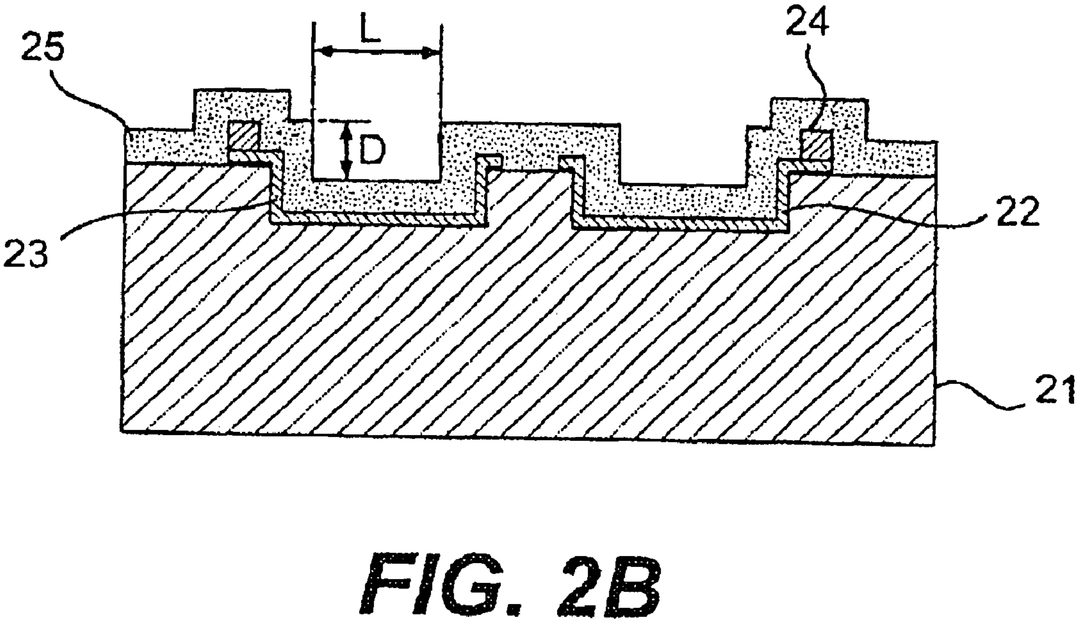

FIGS. 2A and 2B illustrate a schematic plane view and a cross-sectional view of a unit discharge cell for a plasma display panel according to a first embodiment of the present invention.

As shown in FIGS. 2A and 2B, more than one segmented trench 22 may be formed in a glass substrate 21 between bus electrodes 24, so that each trench is isolated in the discharge cell. A transparent conductive layer 23, such as indium tin oxide (ITO), for sustain electrodes is deposited in the trench 22 including the glass substrate 21. Preferably, the bus electrodes 24 are formed on the upper portion of the glass substrate 21 as shown in FIG. 2B. However, the bus electrodes 24 also may be formed partially in the trench 22 or completely in the trench 22. These embodiments are within the scope of the present invention. A transparent dielectric layer 25 and a magnesium oxide layer (not shown) as a protection layer are sequentially deposited over the entire surface.

FIGS. 3A to 3D illustrate top views of various shapes of the trenches of FIGS. 2A and 2B.

Figure 3A:
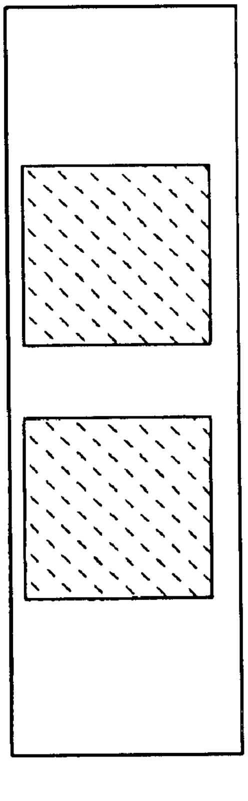
FIGS. 3A to 3D illustrate top views of various shapes of the trenches of FIGS. 2A and 2B.
Figure 3B:
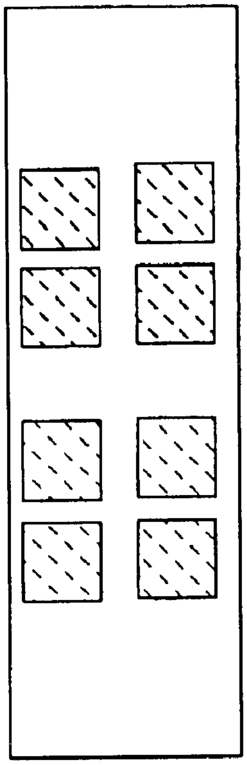
Figure 3C:
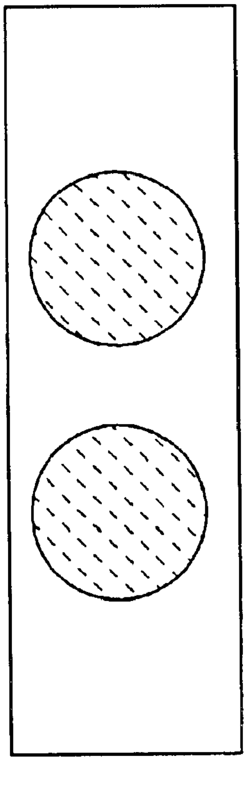
Figure 3D:
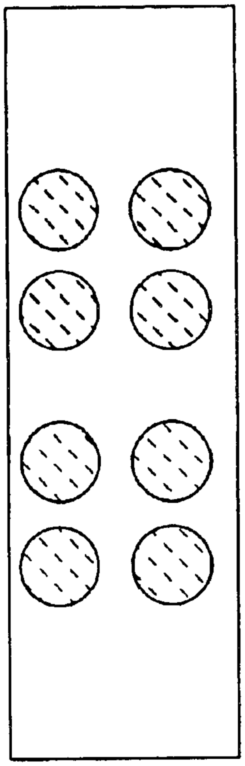

As shown in FIGS. 3A to 3D, the trenches may have any shape including a circular (FIGS. 3C and 3D) or square shape (FIGS. 3A and 3B). Furthermore, although it is not shown in the drawings, the trenches may also be formed in other various geometrical shapes, such as oval or rectangular. More than one shape may also be combined and formed in various sizes in the present invention. Other shapes and combinations will be known to those skilled in the art and are within the scope of the present invention.

FIGS. 4A to 4D illustrate schematic cross-sectional views of the various trenches of FIGS. 2A and 2B.

Figure 4B:
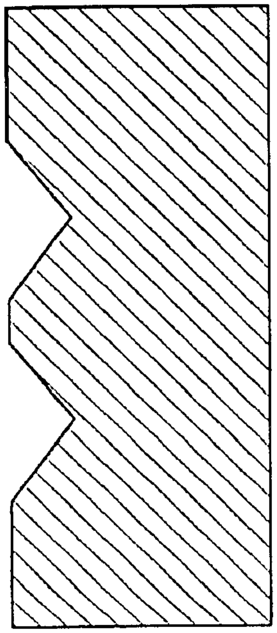
FIGS. 4A to 4D illustrate schematic cross-sectional views of the trenches of FIGS. 2A to 2D.
Figure 4D:
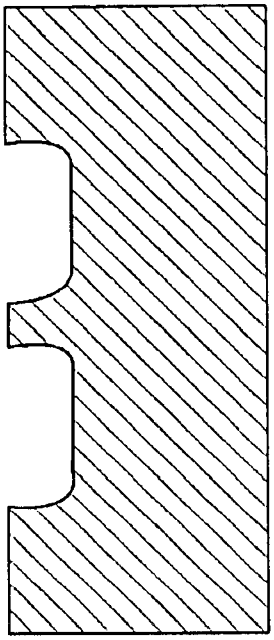
Figure 4A:
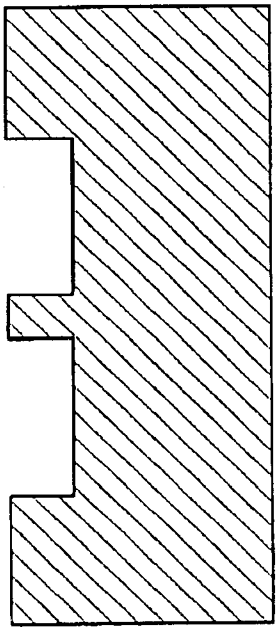
Figure 4C:
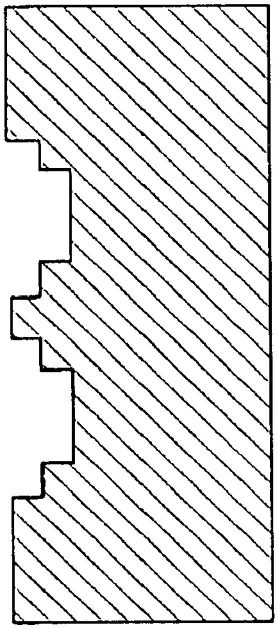

The trenches in the first embodiment may have various cross-sectional shapes, as shown in FIGS. 4A to 4D. For example, they may be one of a rectangular plain trench shape (FIG. 4A), a tilted trench shape (FIG. 4B), a multiple step trench shape (FIG. 4C), and a circular trench shape (FIG. 4D). Thus, a bottom shape of the cross-sectional view may be one of flat, step, V-, and U-shapes. Other shapes and combinations will be known to those skilled in the art and are within the scope of the present invention.

FIGS. 5A to 5D are cross-sectional views illustrating a sequential process for fabricating a discharge cell of a plasma display panel.

The new cell is comprised of one or more trenches carved into the first glass substrate by chemical etching, sandblasting, laser ablation (i.e., excimer or $CO_2$), ultrasonic drilling, or other means. The transparency and the roughness of the substrate layers directly influence the brightness. After carving the trench, the surface roughness can be improved by surface grinding with CeO solution. Two transparent sustain electrodes extend from the top planar substrate surface down two opposite walls of the trench, and in some embodiments, extend along the floor of the trench, and partially on the other two walls. Two silver bus electrodes are located on the top plane of the substrate plate, away from the edge of the trench, but in contact with the sustain electrodes. The length of the trench is defined by the dimension of the trench between the bus electrodes and is generally greater than its width. A coating of insulator is then laid down over the top plane of the substrate, electrodes, trench walls, and floor. This may be accomplished by screen-printing, dipping, using a paste, or taping methods, by way of example only. As shown in FIG. 5D, the depth of the trench without an insulating layer is from 30 to 500 microns, but is preferably from 100 to 200 microns. The length (L) of the trench may be from 100 to 1000 microns, but preferably from 200 to 800 microns. The depth (D) may be from 50 to 350 microns, but will depend on whether one or multiple trenches are employed per cell. An L/D ratio of the trench may be greater than 1 for an optimal performance of the cell.

Figure 5B:
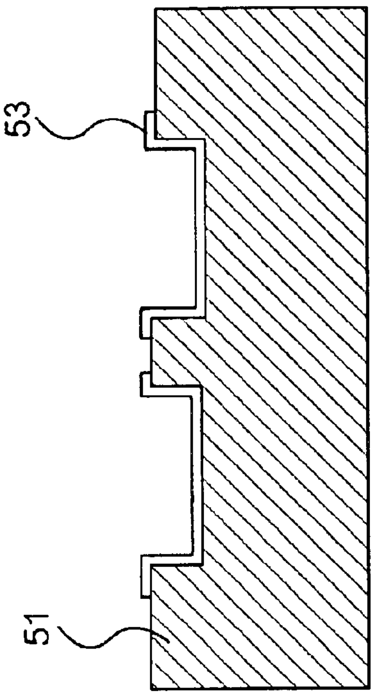
FIGS. 5A to 5D are cross-sectional views illustrating a sequential process for fabricating a discharge cell of a plasma display panel.
Figure 5A:
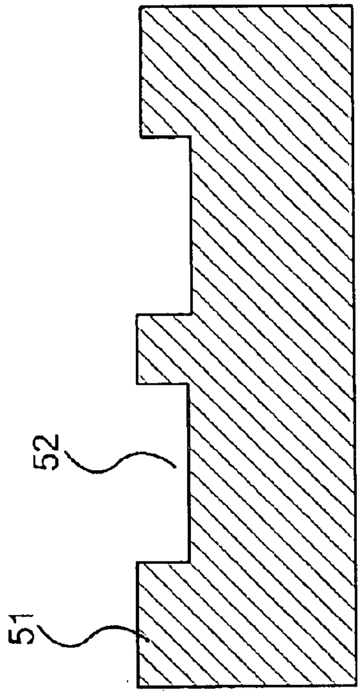
Figure 5C:
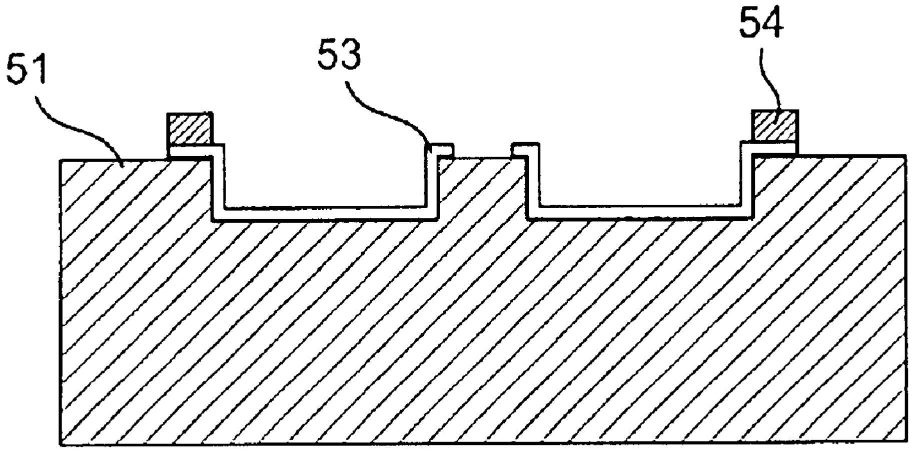
Figure 5D:
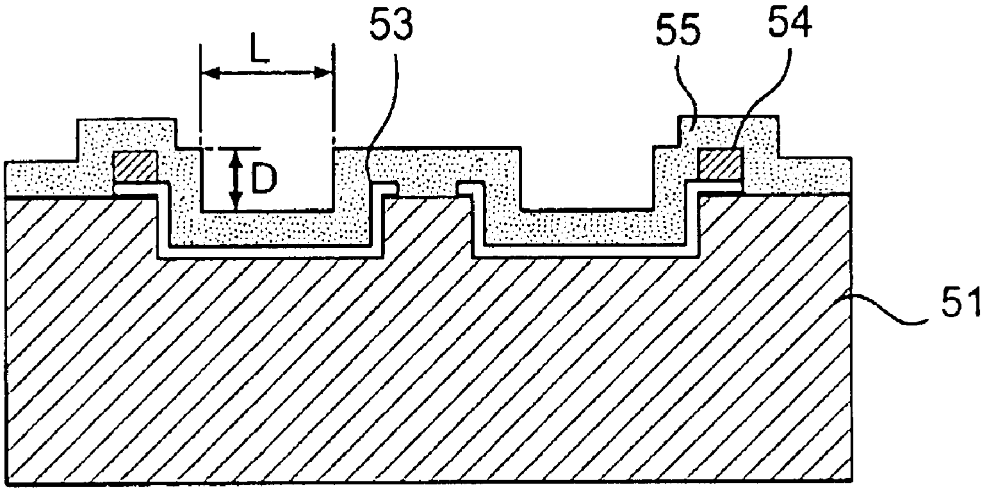

As shown in FIGS. 5A–5D, a glass substrate 51 is processed to form one or more isolated trenches 52 therein by using wet etching or dry etching, as shown in FIG. 5A. For example, a sandblast method, a mechanical process such as polishing, or a pressing molding method may be used for the dry etching. A chemical etching method may be used for the wet etching.

In FIG. 5B, a transparent conductive layer 53 such as ITO is deposited inside the trench 52, preferably including the glass substrate 51 of the display area outside the trench 52. Of course, layer 53 may be only inside the trench and such a structure is within the scope of the present invention. The transparent conductive layer 53 is patterned by using photolithography to form a sustain electrode.

Thereafter, a bus electrode 54 is formed on the edge of the transparent conductive layer 53 outside the trench 52, as shown in FIG. 5C. The bus electrode 54 also may be formed partially in the trench 52 or completely within the trench 54 (not shown).

In FIG. 5D, after forming the bus electrode 54, a dielectric layer 55 is formed on the entire display area by using a screen-printing method, dip coating method, or a spray method. The layer of dielectric material 55, for example, lead oxide (PbO), is then placed over the trench and the electrode structures. The thickness of the dielectric layer will depend on the dielectric constant of the material. However, when using PbO, the dielectric layer will have a thickness between 10 and 100 microns, with a preferred thickness ranging from 20 to 40 microns. The dielectric layer 55 is then coated with a layer of metal oxide (not shown), for example, magnesium oxide (MgO), to provide a source of secondary electrons, and to protect the dielectric layer from erosion due to sputtering from ion bombardment in the plasma.

In addition, a protective layer, such as a magnesium oxide layer (not shown), may be deposited on the dielectric layer 55 to have a thickness of about 3000 to 7000 microns. For example, the protective layer may be deposited by using one of an electron beam evaporation method, a sputtering method, or an ion plating method.

Because of the design of this structure, the discharge occurs mainly in the volume resulting from the creation of the trench 52 in the glass substrate 51. The walls of the trench are substantially vertical in order to maintain electric field lines which are perpendicular to the electrodes, but may be slightly tilted due to manufacturing limitations, which will result in walls that have a slight incline.

Although it is not illustrated in the drawings, the trench may also be formed by depositing a dielectric layer on the entire substrate by using the above-described method and processing the dielectric layer by using the sandblast method. This embodiment may be advantageous in controlling the shape of the trench with more precision.

The dimension of the trench in the present invention may range from about 20 to 20000 microns in horizontal dimension (L) and about 5 to 10000 microns in vertical dimension (D). The trench has a first length perpendicular to the direction of the sustain electrodes and a second length parallel to the direction of the sustain electrode. For an effective operation of the discharge cell, the first length is substantially greater than the second length in the present invention.

The present invention allows for the generation of a positive column in a PDP by various design approaches. For example, the sustain electrodes on the bottom of the trench are covered with the dielectric layer that is sufficiently thick to create a stable plasma discharge almost entirely between the wall portion of the sustain electrodes. In this way, there is little or no electric field contribution from the sustain electrode on the bottom of the trench.

Another cell structure to achieve this field configuration eliminates or nearly eliminates the sustain electrodes on the floor of the trench and decrease the thickness of the dielectric layer on the bottom of the trench to a few tens of microns. This forces the discharge to occur principally between the vertical electrode surfaces of the trench in the present invention.

In these cell structures, a mode of operation called a "positive plasma column" may be established.

A positive plasma column is very stable and efficient plasma which draws a low current simultaneous with high conversion efficiencies of plasma energy to UV light emission. In fact, a positive plasma column is typically the most energy-efficient mode for creating radiation from plasma. A fluorescent lamp is the most common example of this plasma mode in prevalent use. PDP researchers have attempted to establish positive plasma columns in their display cells for many years, but none of the efforts have proved successful. The positive column plasma is highly desirable for PDP's, because a substantial increase in luminescent efficiency is necessary for the successful broad-market commercialization of this technology. For the first time, the present invention establishes such a positive plasma column in a PDP cell.

FIGS. 6A to 6G illustrate perspective views illustrating another sequential process for fabricating a discharge cell of the plasma display panel according to the first embodiment of the present invention.

Figure 6B:
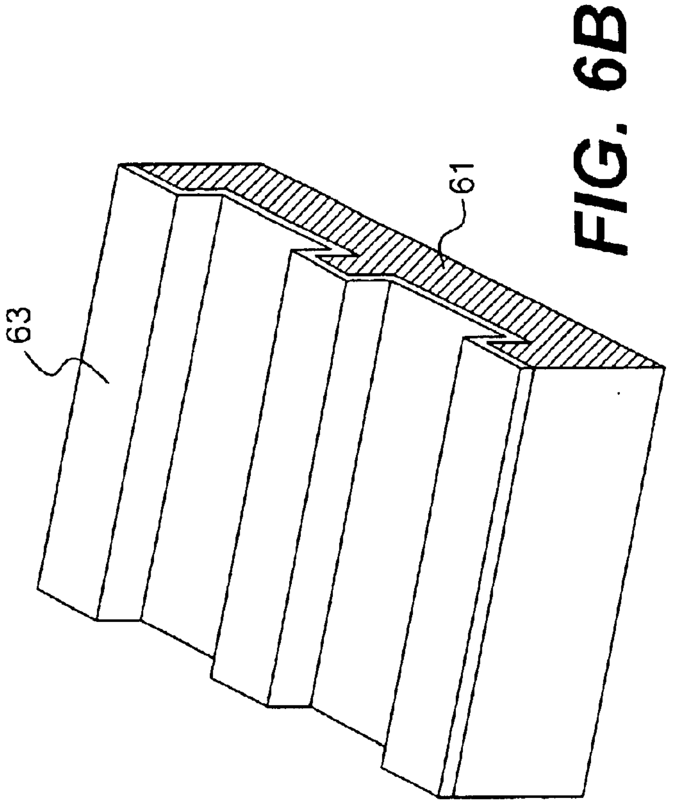
FIGS. 6A to 6G illustrate perspective views illustrating another sequential process for fabricating a discharge cell of the plasma display panel according to a first embodiment of the present invention.
Figure 6A:
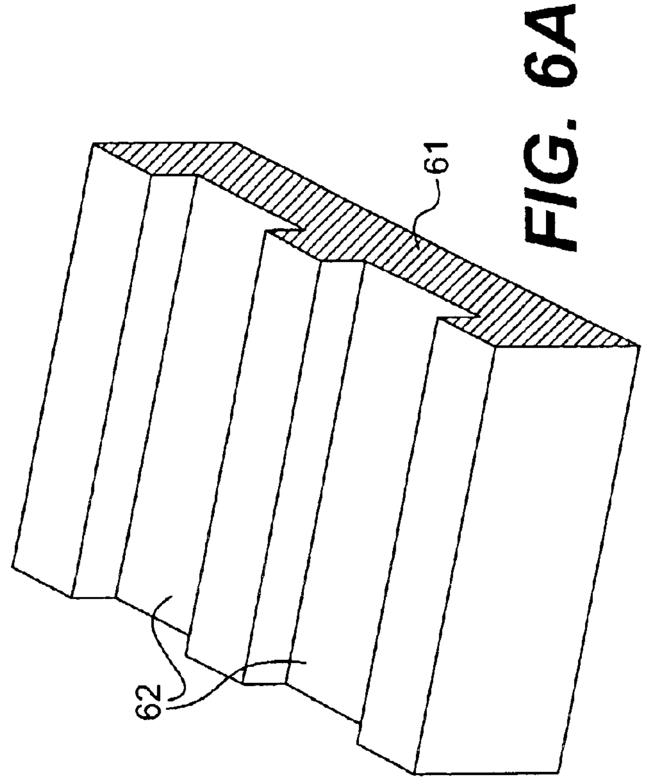

Initially referring to FIG. 6A, a series of grooves 62 is machined into a glass substrate 61 using, for example, chemical etching, laser ablation, sandblasting, or grinding.

In FIG. 6B, a transparent electrode layer 63 is formed on the glass substrate 61 and the trenches 62 formed therein. The transparent conductive layer 63 may be formed of a material, such as indium tin oxide (ITO), tin oxide ($SnO_2$), other transparent conducting oxides, and conductive polymers that withstands subsequent processes. A method for depositing the transparent conductive layer may include one of chemical vapor deposition (CVD), dip coating, spin coating, evaporation (e-beam or other methods), or sputtering.

Figure 6D:
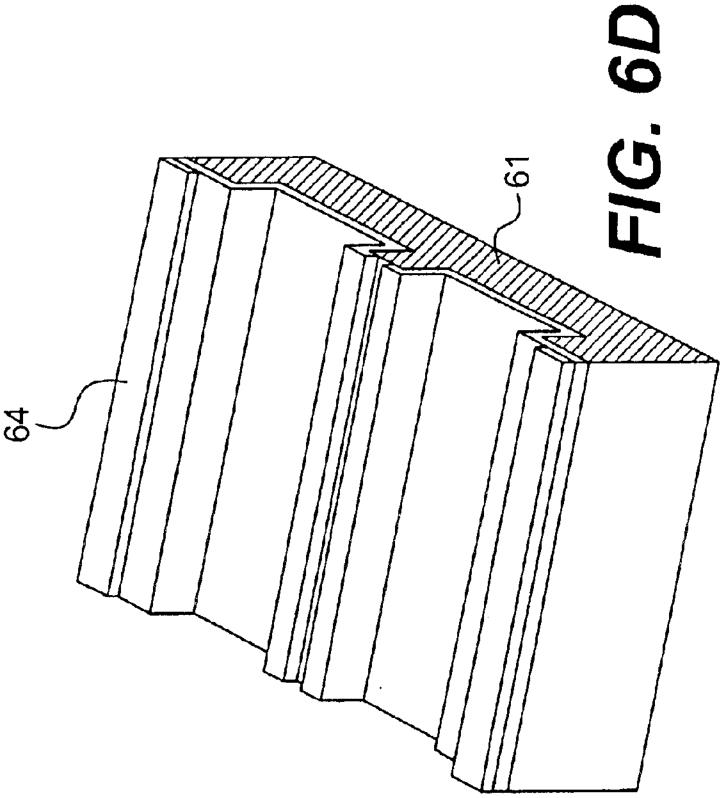
Figure 6C:
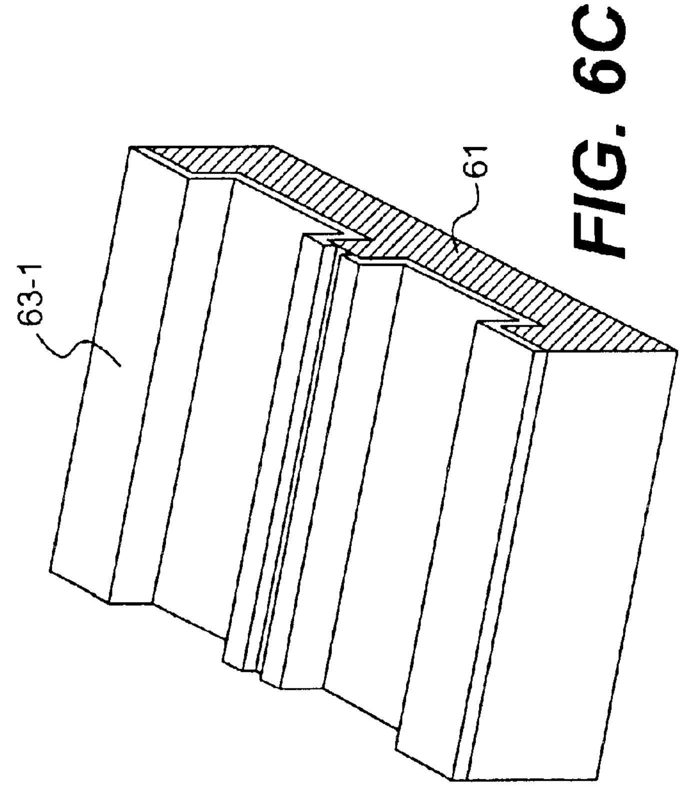

The transparent conductive layer 63 is patterned to form separate sustain electrodes 63-1, as shown in FIG. 6C. The patterning of the transparent electrode layer 63 may be carried out by laser ablation, conventional photolithography, or milling.

In FIG. 6D, bus electrodes 64 are formed on the sustain electrodes 63-1. A material for the bus electrodes 64 may include a conventional paste used in PDP fabrication, for example, thin films of chromium and copper (Cr/Cu/Cr), or chromium and aluminum (Cr/Al), or other combinations of metals typically used in the PDP industry. Photosensitive pastes may also be used for photolithography formation of the bus electrodes. A method for fabricating the bus electrodes may include printing, thin film process and photolithography, or thick film process and photolithography.

Figure 6F:
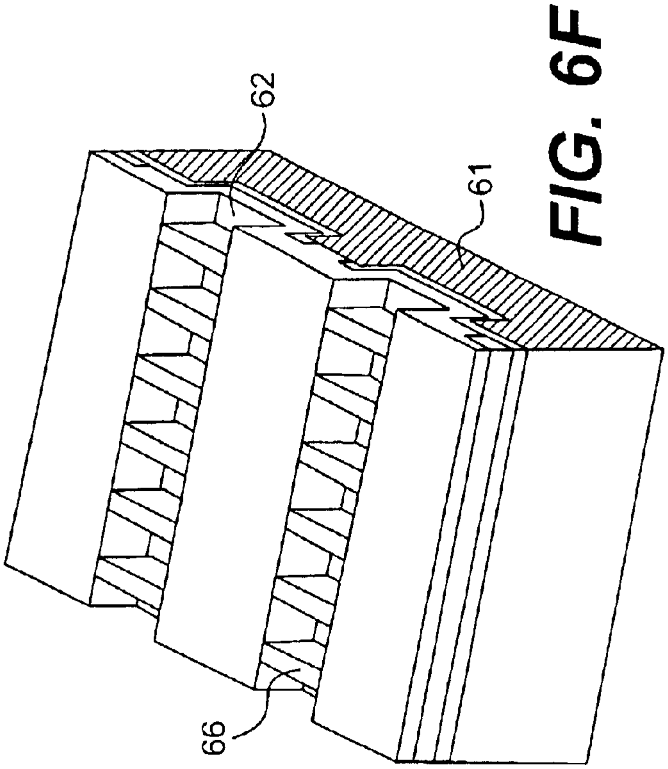
Figure 6E:
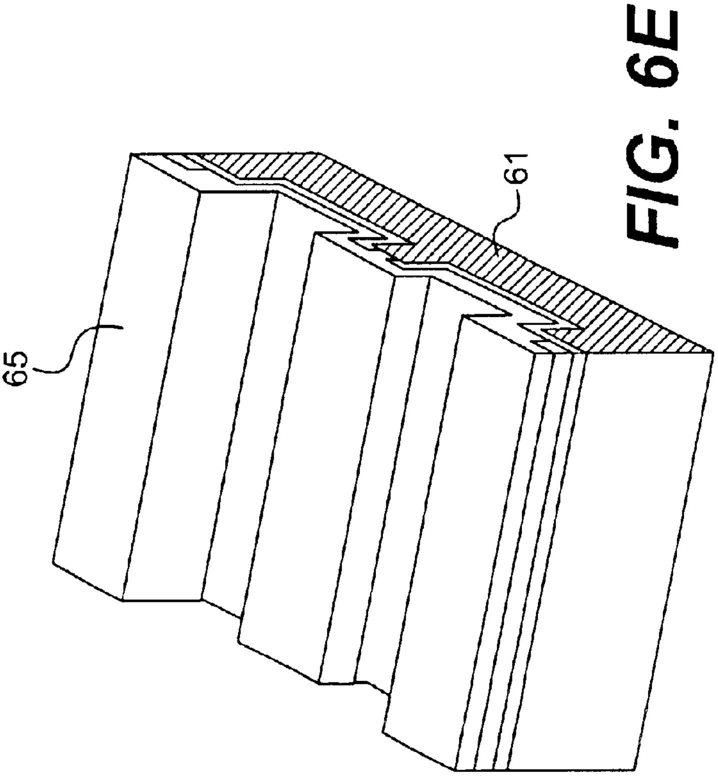

A dielectric layer 65 is deposited on the entire surface covering the bus electrodes 64 and the transparent electrodes 63-1, as shown in FIG. 6E. The dielectric layer 65 may be formed of one of a PbO paste, a PbO green sheet material, and a dielectric slurry. A method of depositing the dielectric layer may include one of printing, laminating, or dipping.

In FIG. 6F, a plurality of partitions 66 are formed in the grooves 62 to form isolated trenches acting as discharge cells. The partitions 66 may be formed of ceramic pastes similar to those used to form barrier ribs in conventional PDP production or photosensitive pastes. The partitions 66 may be formed by using a combination of sandblasting and thick film processing or thick film processing and photolithography.

Figure 6G:
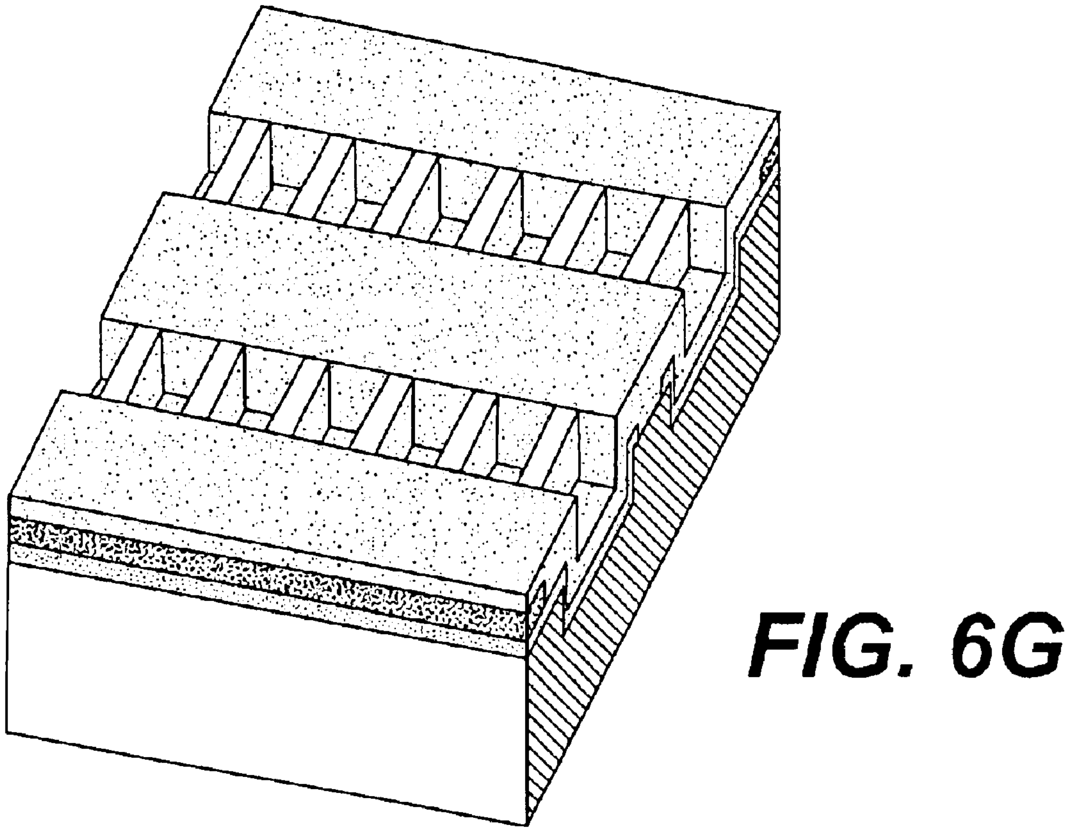

In FIG. 6G, a magnesium oxide (MgO) coating is applied to the entire surface as a protection layer. The MgO coating may be applied by using a sputtering process, an evaporation process, or any other process for depositing an oxide layer.

Figure 7A:
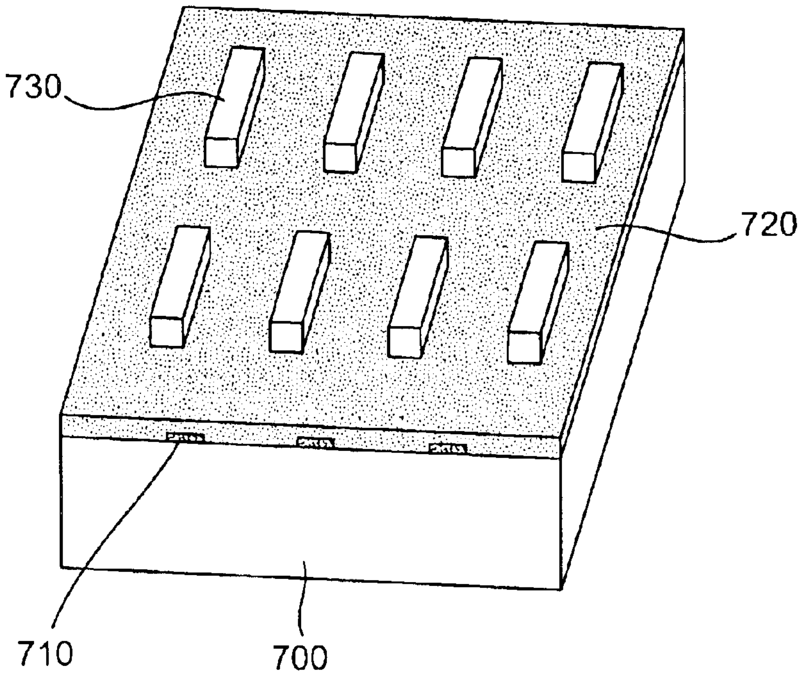
FIGS. 7A to 7C illustrate alternate methods of forming a dielectric partition, as shown in FIG. 6F.
Figure 7B:
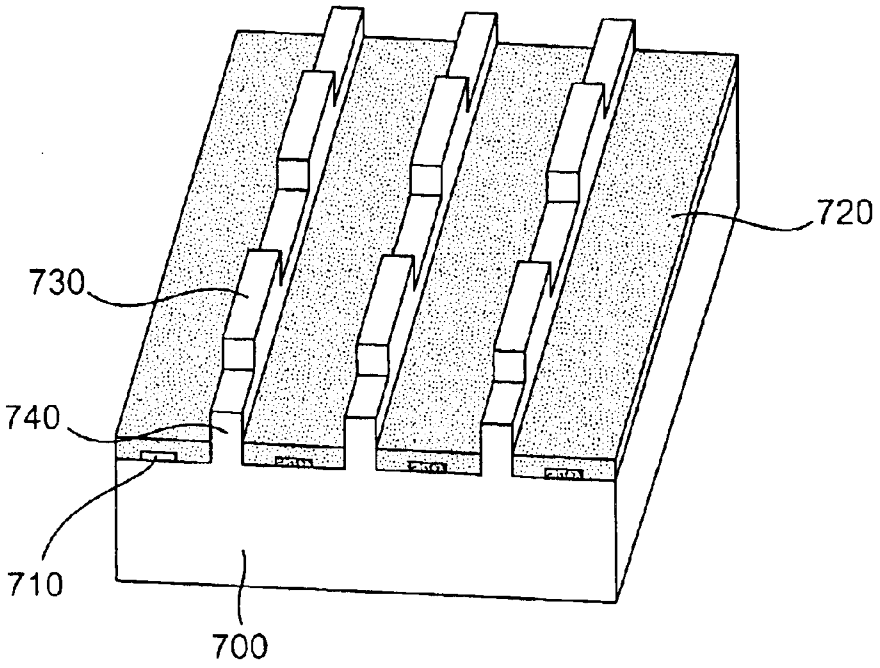
Figure 7C:
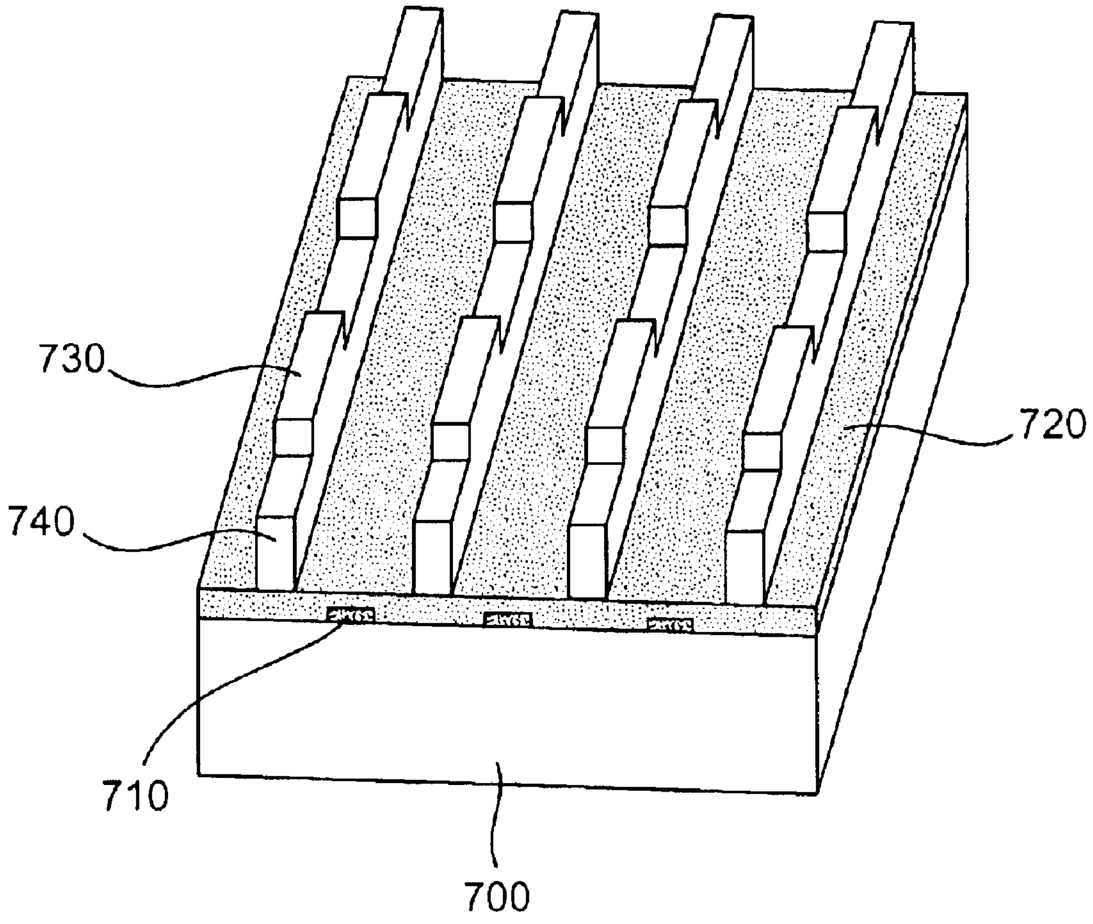

FIGS. 7A to 7C illustrate alternative methods to that described in FIGS. 6A–6F of forming a partition dielectric. In these processes, the partition dielectric is placed on the back panel, which contains address electrodes and phosphor layers. Such an approach has many important advantages. For example, there may be some cost advantages since the process will not require another coating step of dielectric followed by a machining step.

In FIG. 7A, a back panel is produced by laying down an address electrodes 710 onto a glass plate 700 in the conventional manner. The panel is then coated with a dielectric layer 720. Partition ribs 730 are placed over the dielectric layer 720, with a printing process or other appropriate method. In this structure, barrier ribs may not be necessary since the nesting of the front panel to the back panel forms the isolated cell volumes.

In FIG. 7B, the glass plate is etched with deep grooves to create barrier ribs 740. The dielectric partitions 730 are formed onto the barrier ribs by printing or with a secondary etching process with an additional mask. Electrodes 710 are then placed on the glass plate 700 and coated with the dielectric layer 720.

FIG. 7C illustrates the barrier rib structure 740, with the dielectric barriers 730 placed directly onto the barrier rib structure.

FIGS. 8A to 8E illustrate an alternative method of producing bus electrodes for a panel designed with the present invention.

Figure 8B:
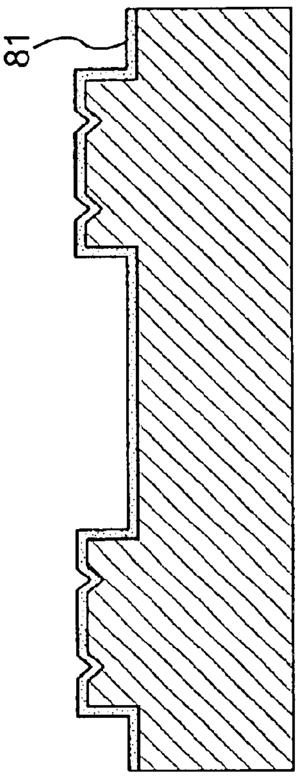
FIGS. 8A to 8E illustrate an alternate method of producing bus electrodes for a panel designed with the present invention.
Figure 8A:
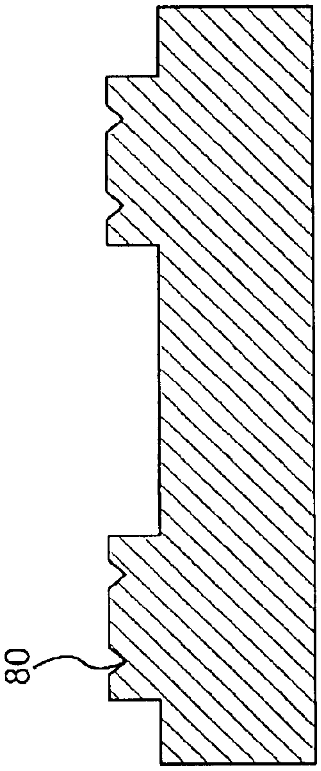
Figure 8C:
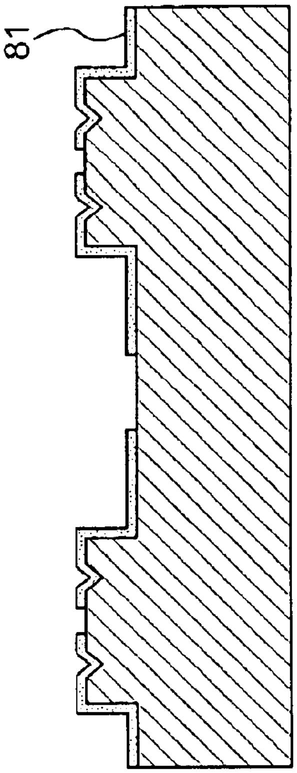
Figure 8D:
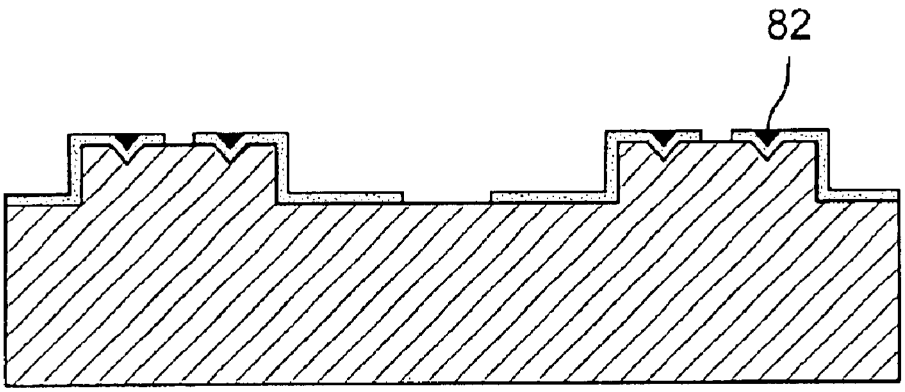
Figure 8E:
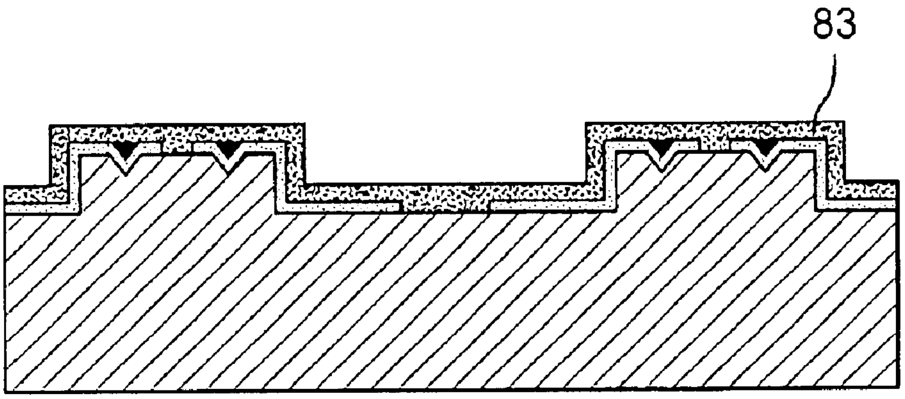

Trenches 80 are carved into the top of the glass on either side of trench grooves, as shown in FIG. 8A. In FIG. 8B, the glass is then coated with ITO or other transparent conducting materials 81. The transparent conductor 81 is then etched to form electrode patterns in FIG. 8C. The grooves are then filled with silver or other conductive material 82 by using a printing process or other suitable method in FIG. 8D. In FIG. 8E, the entire panel is then coated with dielectric material 83 with, for example, a dipping process, a printing process, or a lamination process.

FIGS. 9A to 9F are perspective views illustrating another sequential process for fabricating a discharge cell of the plasma display panel according to the first embodiment of the present invention.

Figure 9B:
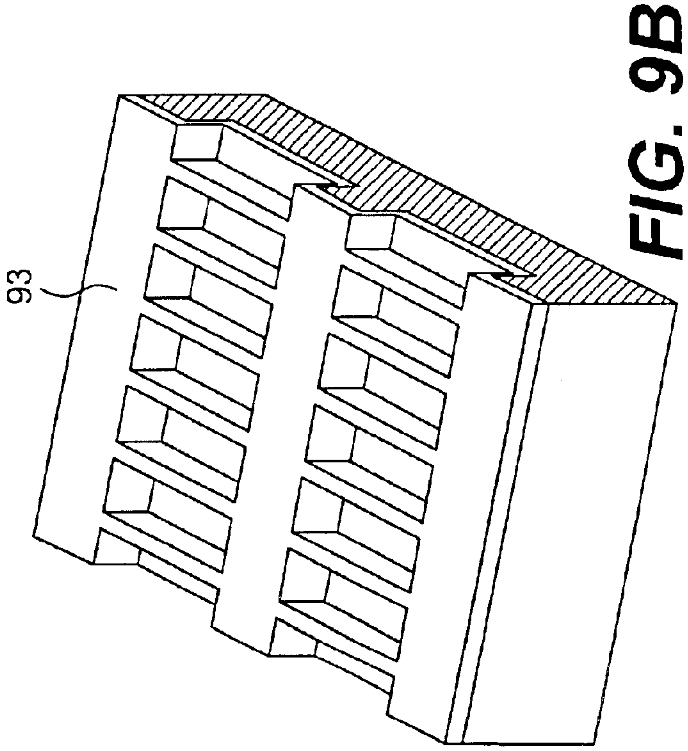
FIGS. 9A to 9F illustrate perspective views illustrating another sequential process for fabricating a discharge cell of a plasma display panel according to the first embodiment of the present invention.
Figure 9A:
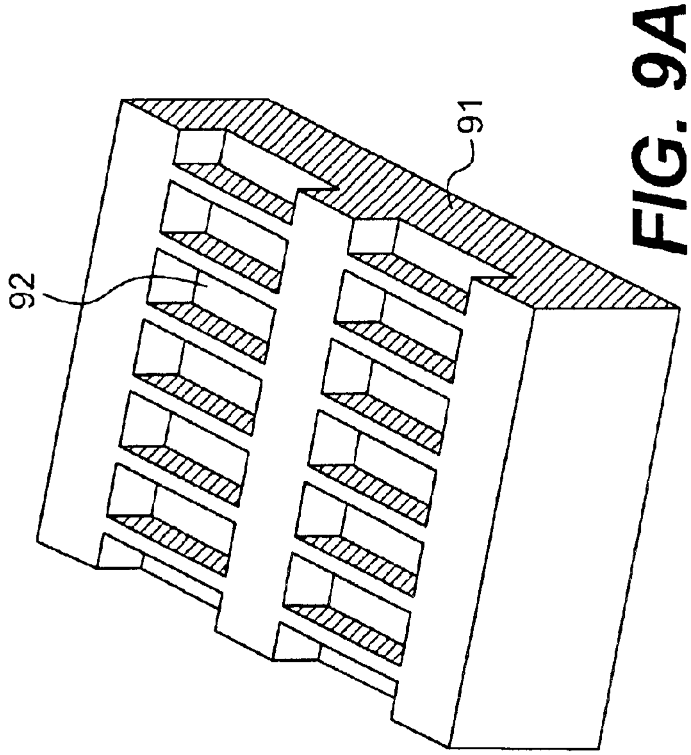

In FIG. 9A, a plurality of isolated trenches 92 are machined into a glass substrate 91 using chemical etching, laser ablation, sandblasting, or grinding. In this process, the number of processing steps may be reduced compared to the previous method.

A transparent conductive layer 93 for a sustain electrode is formed on the glass substrate 91 and the isolated trenches 92, as shown in FIG. 9B. The transparent conductive layer 93 may be formed of a material, such as indium tin oxide (ITO), tin oxide ($SnO_2$), other transparent conducting oxides, or conductive polymers as long as the conductive polymers withstand subsequent processing steps. A method for depositing the transparent conductive layer 93 may include one of chemical vapor deposition (CVD), dip coating, evaporation (e-beam or other methods), or sputtering.

Figure 9D:
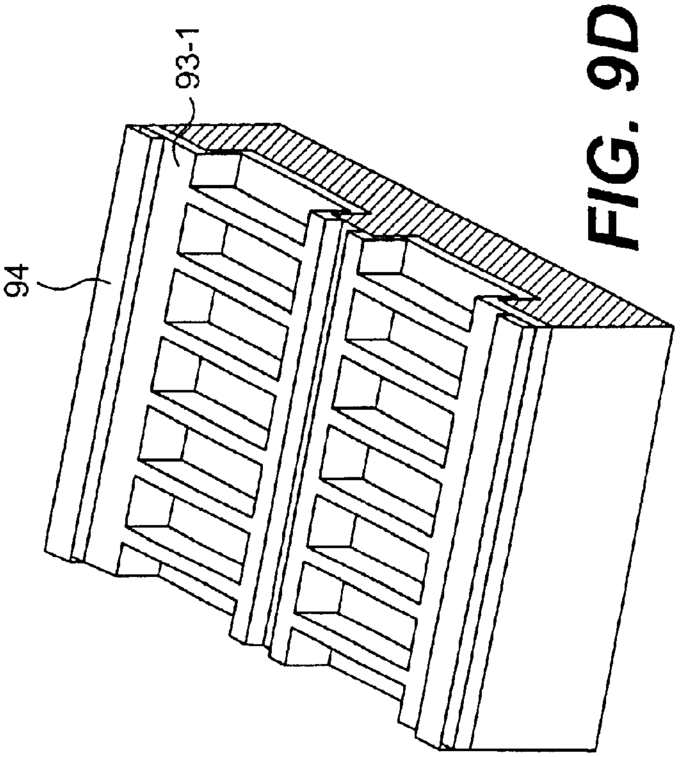
Figure 9C:
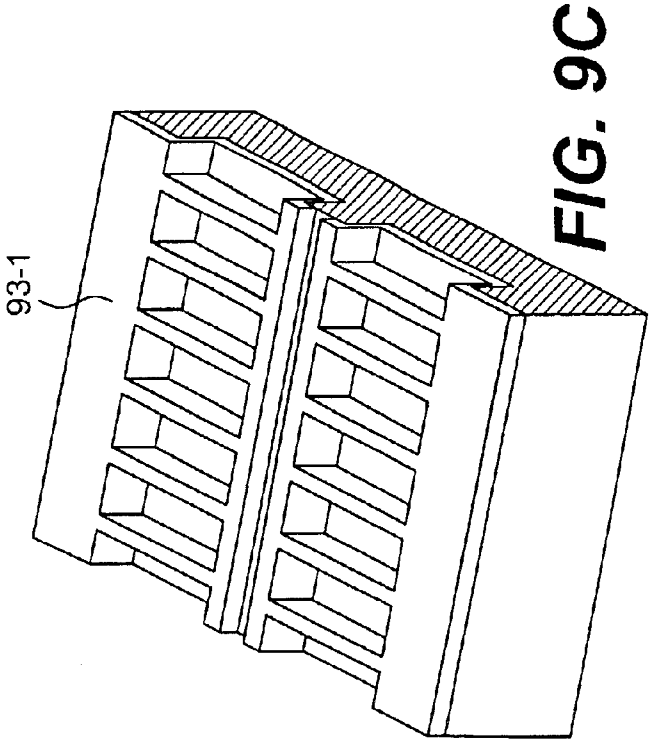

FIG. 9C illustrates that the transparent conductive layer 93 is patterned to form separate sustain electrodes 93-1. This patterning of the transparent electrode structure may be performed by using one of laser ablation, conventional photolithography, or milling.

In FIG. 9D, bus electrodes 94 are formed on the sustain electrodes 93-1. The bus electrodes 94 are positioned outside the trenches 92. The bus electrodes 94 may be formed of one of a conventional paste used in PDP fabrication, for example, thin films of chromium and copper (Cr/Cu/Cr), or chromium and aluminum (Cr/Al), or other combinations of metals used in the PDP industry. Photosensitive pastes may also be used for photolithography formation of the bus electrodes 94. A method for forming the bus electrodes may include one of printing, thin film process and photolithography, or thick film process and photolithography.

Figure 9F:
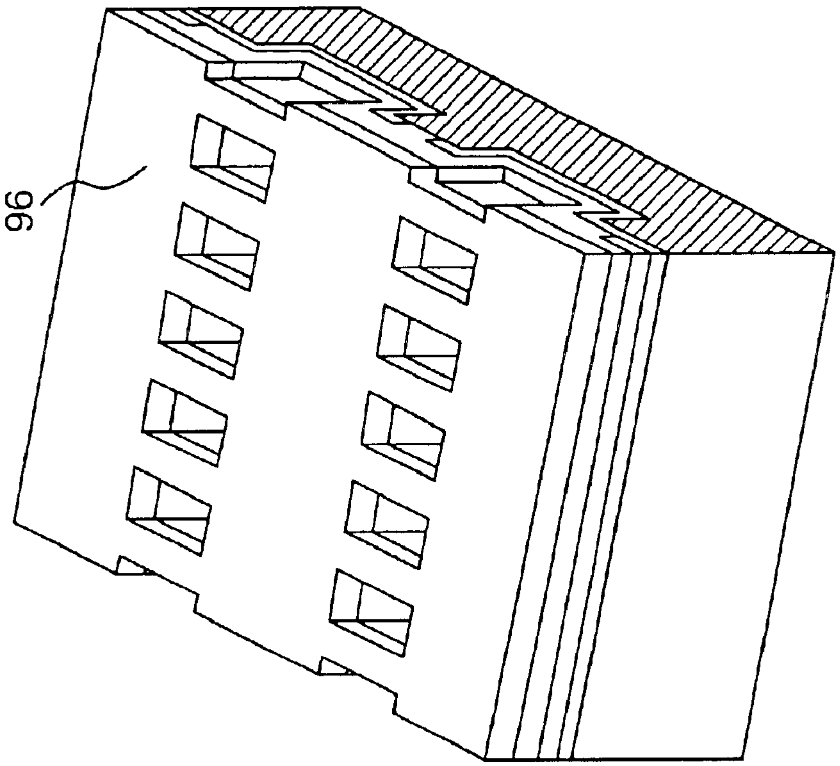
Figure 9E:
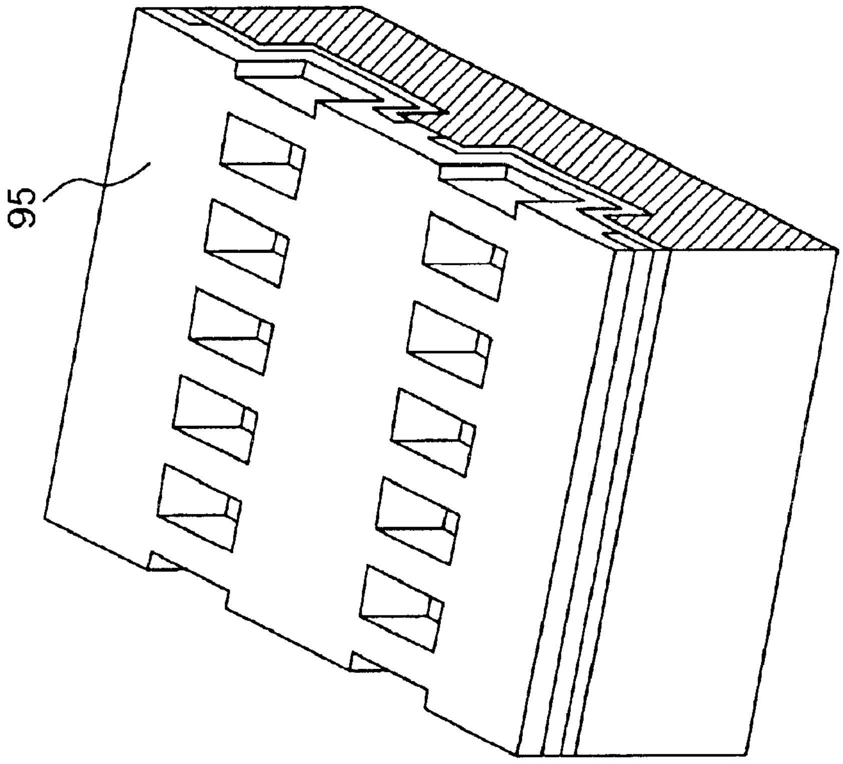

A dielectric layer 95 is formed over the structure covering the bus electrodes 94 and the transparent electrodes 93-1, as shown in FIG. 9E. The dielectric layer 95 may be formed of one of a PbO paste, a PbO green sheet material, or dielectric slurry. A method of forming the dielectric layer may include one of printing, laminating, or dipping.

In FIG. 9F, a magnesium oxide (MgO) coating 96 may be applied to the entire structure. The MgO coating may be applied by using a sputtering process, an evaporation process, or any process for depositing an oxide layer.

FIGS. 10A to 10E illustrate a schematic plane view and a cross-sectional view of a unit discharge cell for a plasma display panel according to a second embodiment of the present invention.

Figure 10A:
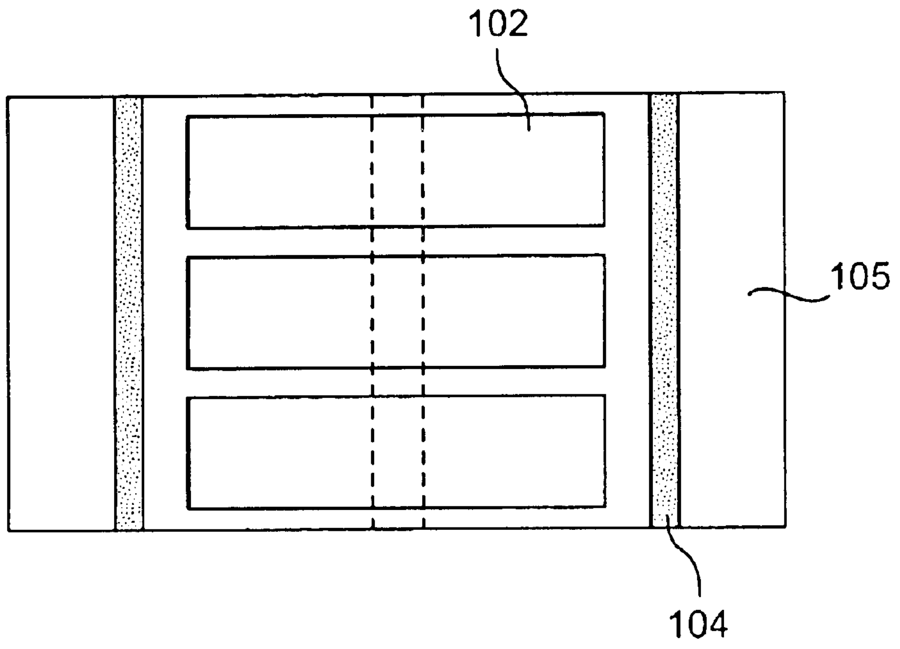
FIGS. 10A to 10E illustrate a schematic plane view and a cross-sectional view of a unit discharge cell for a plasma display panel according to a second embodiment of the present invention.
Figure 10B:
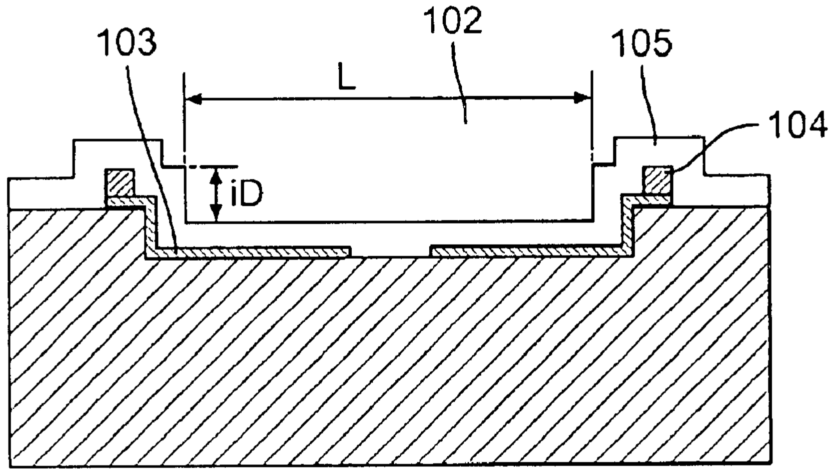

As shown in FIGS. 10A and 10B, more than one continuous trench 102 may be formed in a glass substrate 101 between bus electrodes 104. A transparent electrode 103, such as ITO, is formed in the trenches 102. A portion of the transparent electrode 103 is extended outside the trenches on the substrate 101. A transparent dielectric layer 105 and a magnesium oxide (MgO) layer (not shown) are sequentially formed on the structure.

FIGS. 11A to 11D are partial top views of the trenches shown in FIGS. 10A and 10B.

As shown in FIGS. 11A to 11D, the continuous trenches may be formed to be one or more rectangular shapes in the unit cell. Also, the trenches may have a shape other than a rectangular shape, such as an elliptical shape.

Figure 10D:
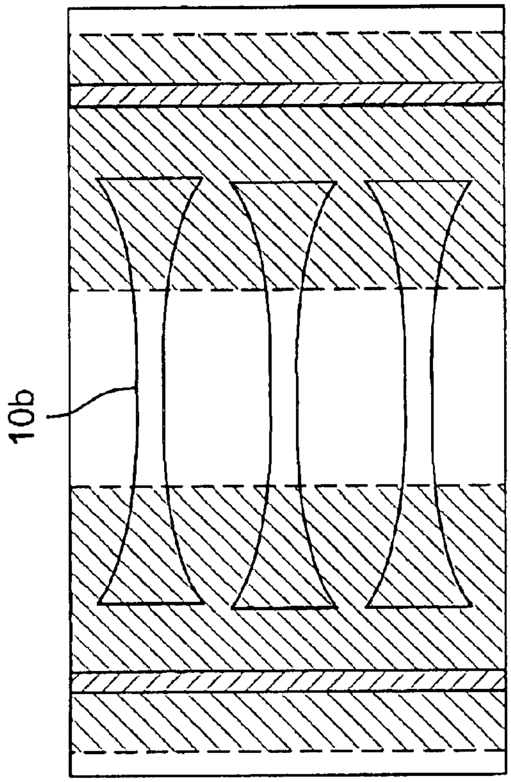
Figure 10C:
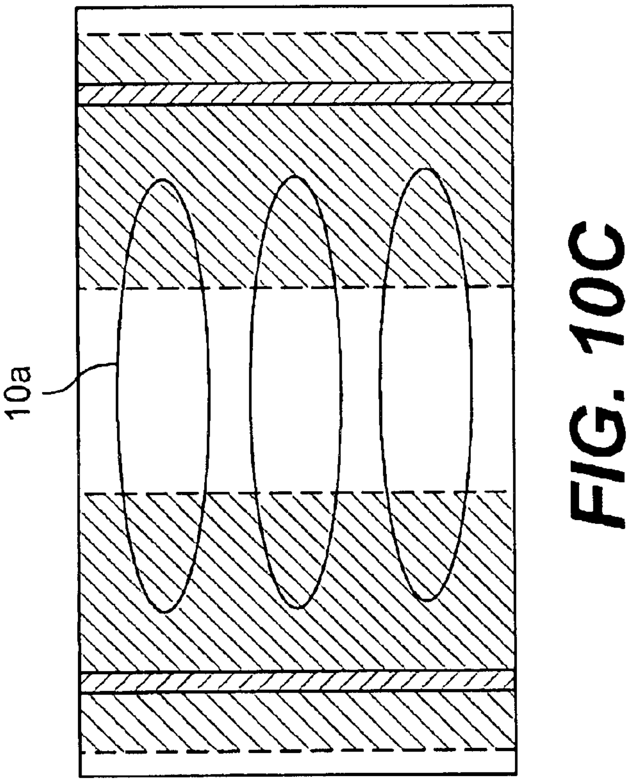
Figure 10E:
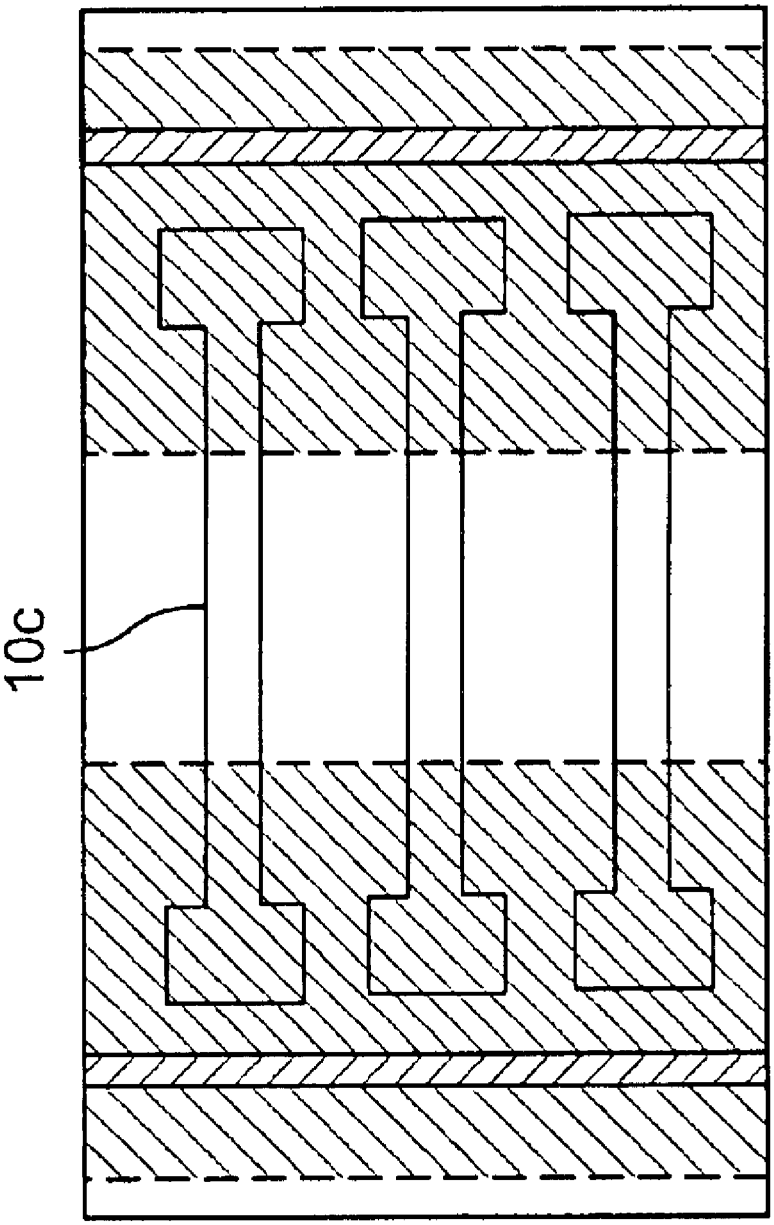
Figure 11B:
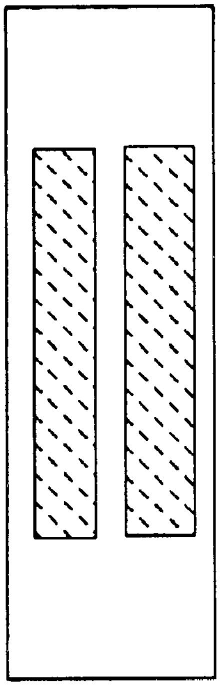
FIGS. 11A to 11D are partial top views of the trenches shown in FIGS. 10A and 10B.
Figure 11D:
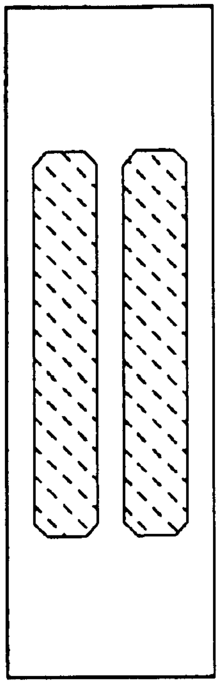
Figure 11A:
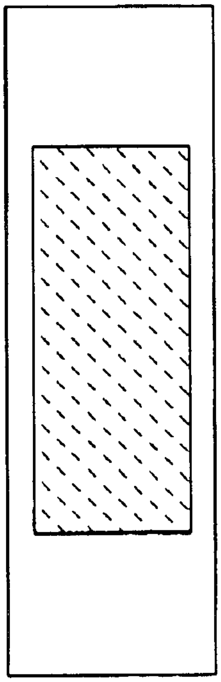
Figure 11C:
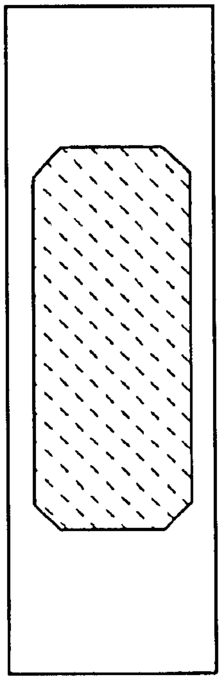

FIGS. 10C to 10E are plane views illustrating different shapes of the trenches of the unit discharge cell.

FIG. 10C shows that a trench shape 10*a* is oval. In FIG. 10D, a trench shape 10*b* is tapered toward the center of the trench. FIG. 10E illustrates a trench shape 10*c* formed in a dumbbell shape. While these shapes are shown in the present invention, other shapes are also possible and considered within the scope of the present invention.

In order to optimize the cell performance, the distance that the sustain electrodes extend from the sidewalls along the bottom or floor of the trench may be varied.

Figure 12B:
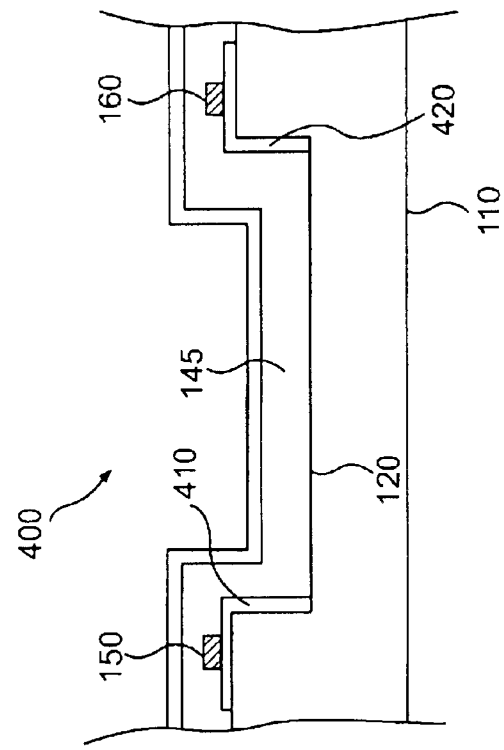
FIGS. 12A to 12C illustrate embodiments with varied gaps between the sustain electrodes.
Figure 12A:
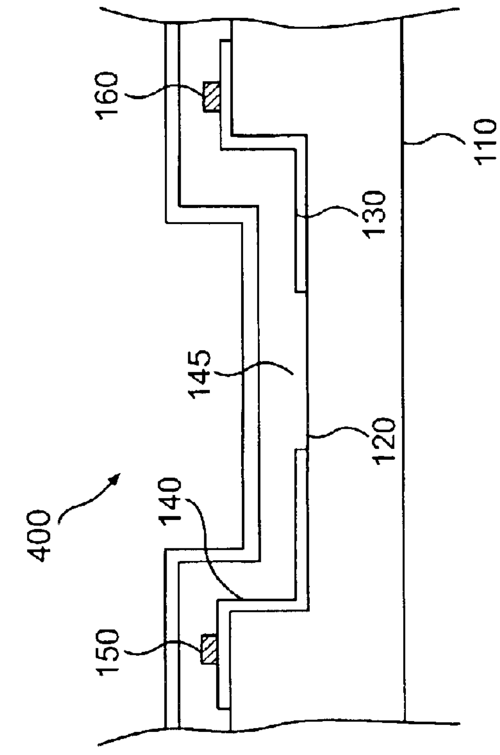
Figure 12C:
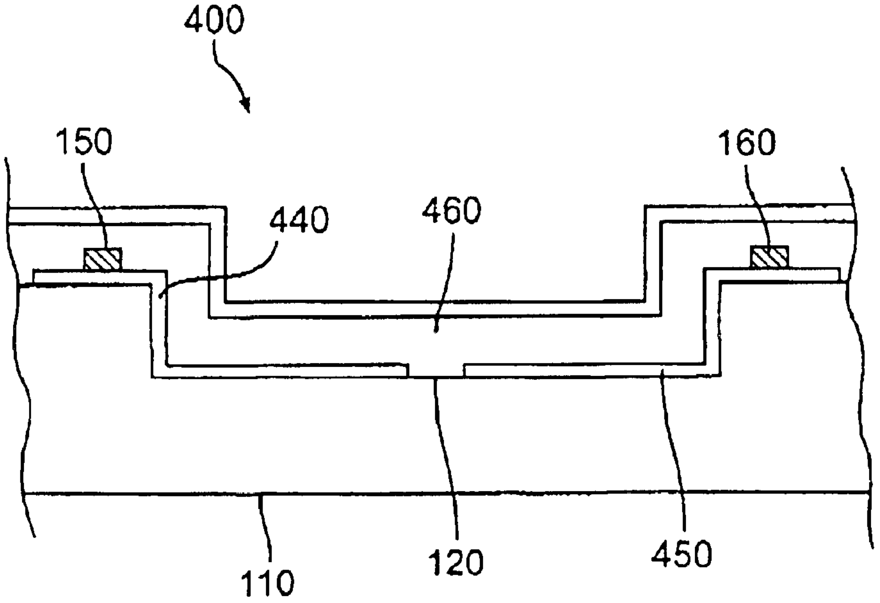

FIGS. 12A to 12C illustrate embodiments with varied gaps between the sustain electrodes.

In FIG. 12A, sustain electrodes 130 and 140 are spaced such that a gap 145 between the electrodes makes up approximately a third of the length of the trench 120 in the glass substrate 110.

In FIG. 12B, sustain electrodes 410 and 420 only cover the walls of the trench 120 in the glass substrate 110, and a gap 145 between electrodes is equal to or nearly equal to the entire length of the trench 120 in the glass substrate 110.

In FIG. 12C, by contrast, sustain electrodes 440 and 450 are fashioned in such a manner that a gap 460 between the two electrodes is very small, and the electrodes 440 and 450 nearly cover the entire trench floor 120 created in the glass substrate 110.

Figure 12D:
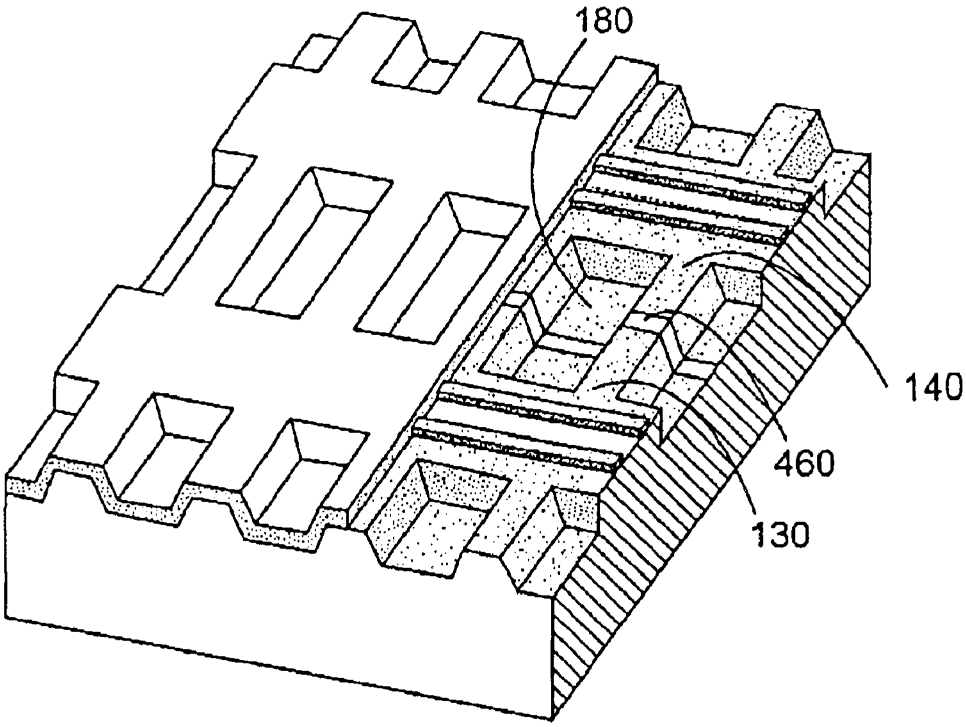
FIG. 12D illustrates a three-dimensional view of a trench structure with a gap between the sustain electrodes.

FIG. 12D illustrates a three-dimensional view of a trench structure 180 with a gap 460 between the sustain electrodes 140 and 130. In this particular case, the gap 460 is approximately 100 microns, but it may be narrower or wider as long as it minimizes a driving voltage and maximizes luminescent efficiency.

Figure 12E:
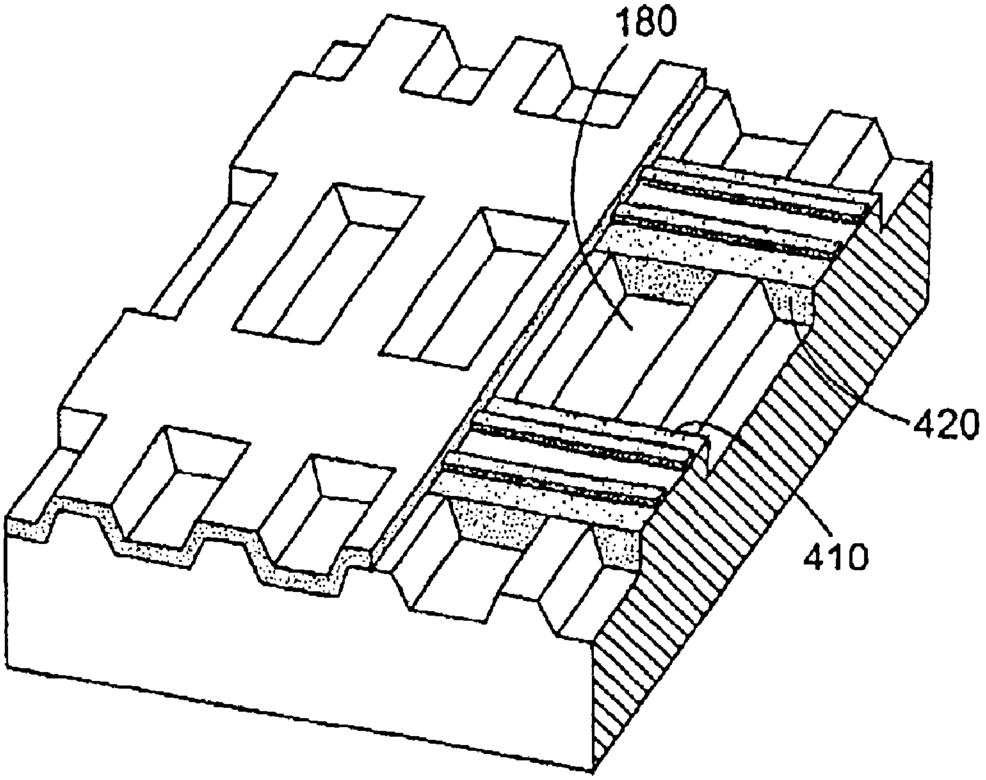
FIG. 12E illustrates a three-dimensional view of the structure described in FIG. 12B.

FIG. 12E illustrates a three-dimensional view of the structure described in FIG. 12B. In this case, the sustain electrodes 410 and 420 reside only on one pair of opposing walls of the trench 180.

One of the above-described structures for establishing a positive plasma column is to increase the thickness of the insulating layer (e.g., PbO) on the trench floor, compared to that on the walls and the top plane of the substrate plate. This effectively shields the electrode area placed on the floor from the main discharge, limiting the electric field lines to extend perpendicularly from one wall electrode to the other.

Figure 12F:
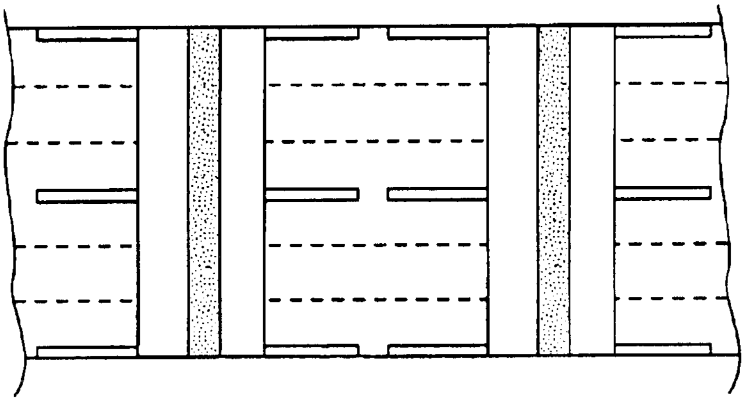
FIGS. 12F to 12H are schematic plane views of different shapes of the sustain electrodes at the bottom of the trench.
Figure 12G:
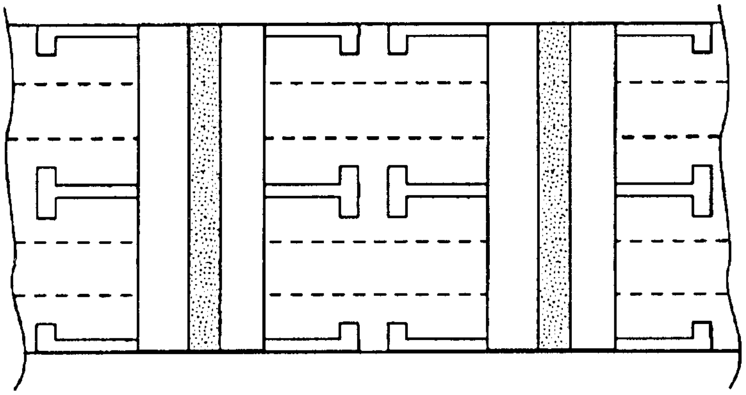
Figure 12H:
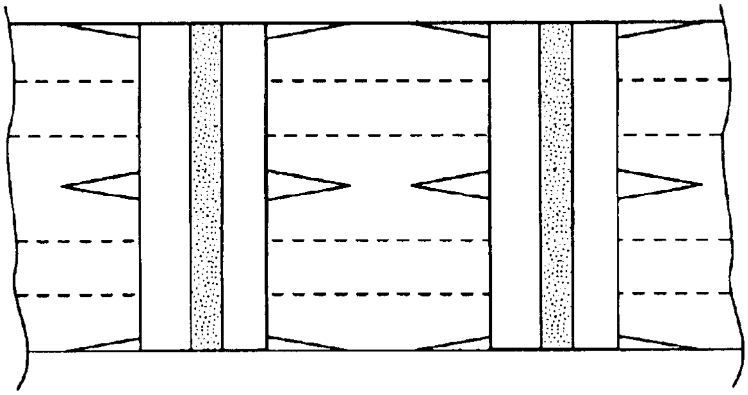
Figure 12I:
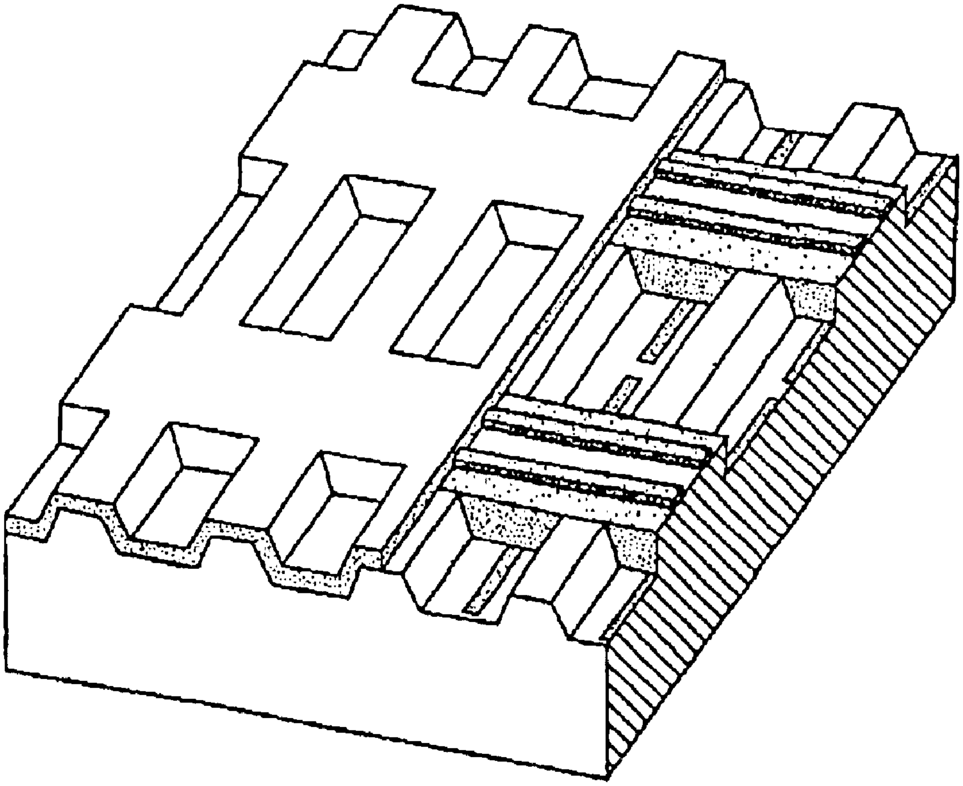
FIG. 12I is a perspective view of FIG. 12F.
Figure 13A:
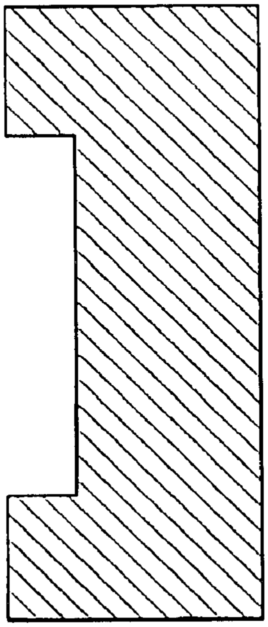
FIGS. 13A to 13D illustrate schematic cross-sectional views of the trenches of the second embodiment, as shown in FIGS. 10A and 10B.
Figure 13B:
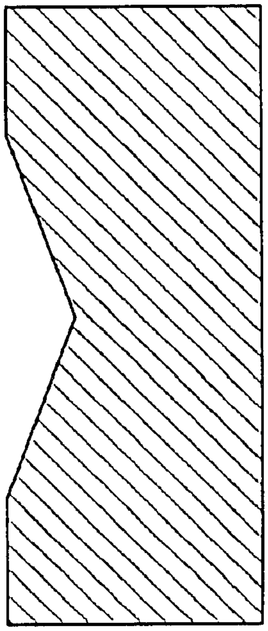
Figure 13C:
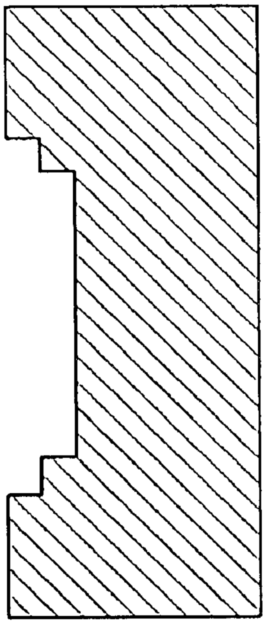
Figure 13D:
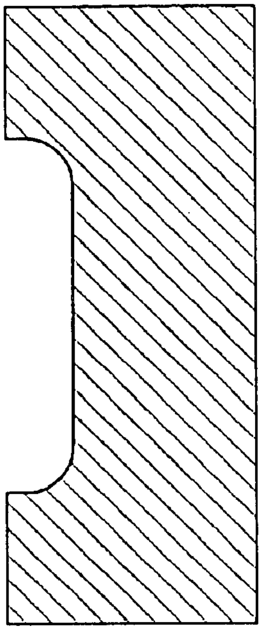

Another approach is to shape the sustain electrode at the bottom of the trenches as shown in FIGS. 12F to 12H. FIGS. 12F to 12H are schematic plane views of different shapes of the sustain electrodes at the bottom of the trench. FIG. 12I is a perspective view of FIG. 12F. As shown in the drawings, portions of the sustain electrode at the bottom of the trenches are removed, so that the sustain electrode has a shape of one of stripe, hammer, and spike shapes, respectively.

Although not shown in the figures, a variation of this embodiment of the present invention includes sustain electrodes that have portions removed both at the bottom of the trenches and also on the sidewalls of the trench.

FIGS. 13A to 13D illustrate schematic cross-sectional views of the trenches of the second embodiment, as shown in FIGS. 10A and 10B.

The trenches of the second embodiment may have various cross-sectional shapes. For example, they may be one of a plain trench shape, a tilted trench shape, a multiple step trench shape, and a circular trench shape. Thus, a bottom shape of the cross-sectional view may be one of flat, step, V-, and U-shapes.

Conventional PDP cells are separated by barrier ribs formed as part of the glass substrate that contains the address electrode and phosphors. An alternative design is to create the barrier ribs on the substrate containing the sustain electrodes.

Figure 14:
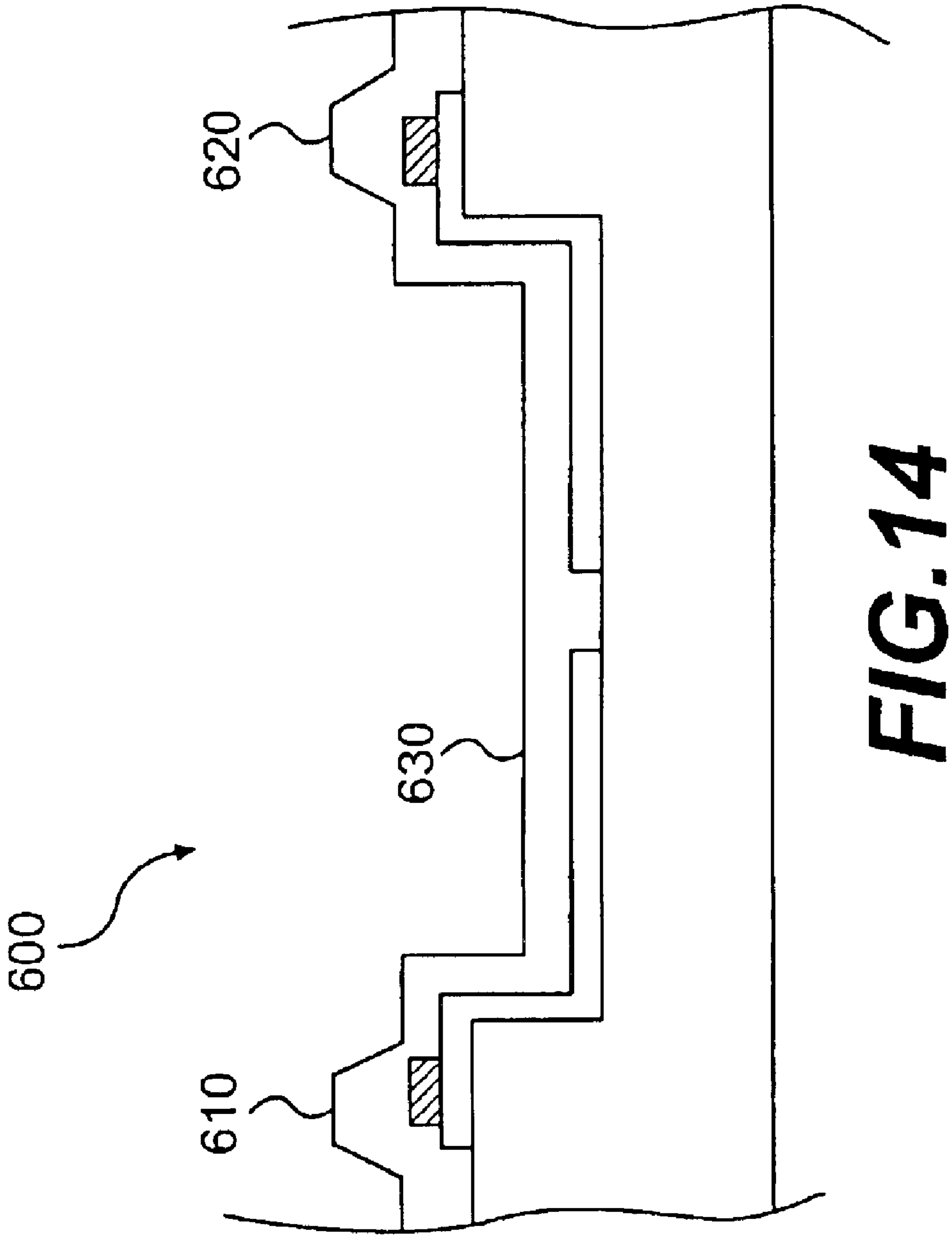
FIG. 14 is an alternate design of barrier ribs on the substrate according to the present invention.

FIG. 14 illustrates this inventive embodiment, whereby barrier ribs 610 and 620 are grown, etched, sandblasted, or otherwise placed or bonded to the dielectric layer 630. The ribs 610 and 620 may also be deposited and shaped along with the dielectric layer 630. This may provide an easier alignment between the top and bottom substrates of the PDP. It may also provide a simple structure for the phosphor layer. The phosphor plate may be as simple as a flat surface with address electrodes and a phosphor coating. This unique structure may be produced by using a two-step sandblasting or etching process using two masks, wherein one mask is used to form the barrier rib, and another mask is used to form the trench.

Figure 15B:
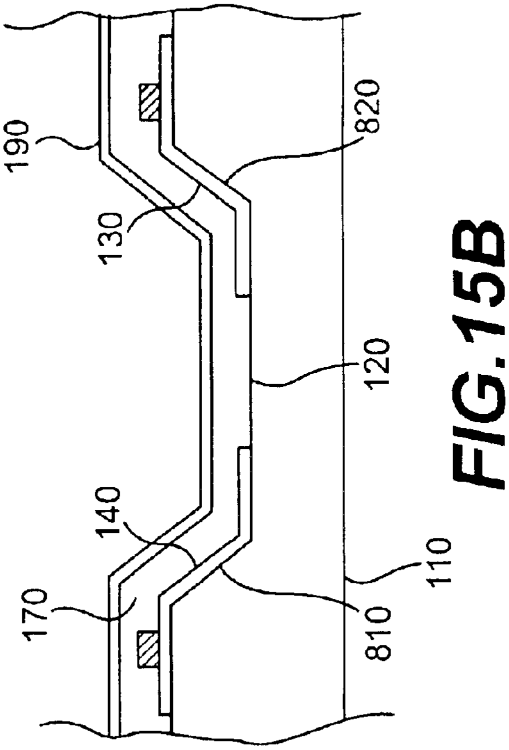
FIGS. 15A to 15C illustrate a cell structure having tilted trench walls according to a third embodiment of the present invention.
Figure 15C:
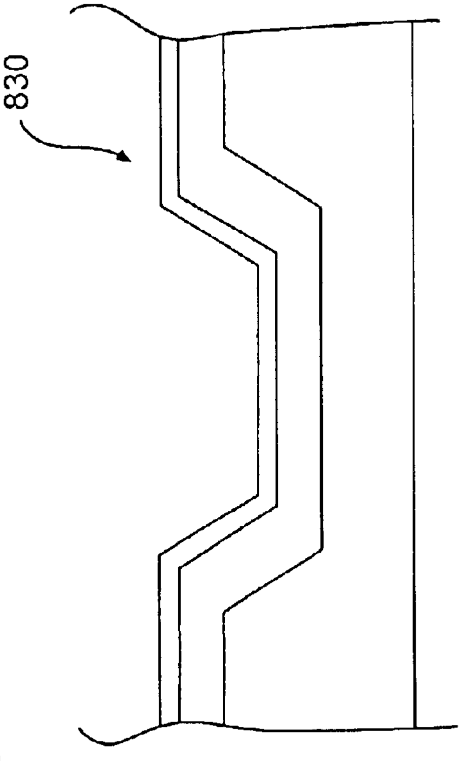
Figure 15A:
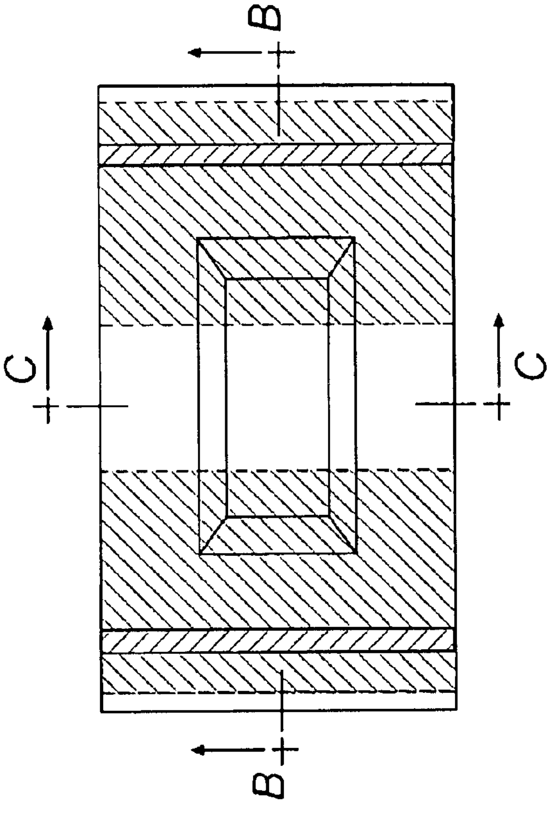

FIGS. 15A to 15C illustrate a cell structure having tilted trench walls according to a third embodiment of the present invention.

In FIG. 15A, a top view of the cell structure is shown with a trench 805 having tilted walls. In FIG. 15B, a cross-sectional view along line B—B indicates that walls 810 and 820 of a trench 120 cut in a glass substrate 110 are tilted away from the center of the trench at a predetermined angle. This also causes electrodes 130 and 140 to be tilted, as well as a dielectric layer 170. The tilt in the wall may be of any angle, and may be greater than 45° from the horizontal direction. FIG. 15C illustrates a cross-section of the cell along line C—C indicating that the walls of the trench are also tilted across this cross-section of the trench.

Figure 16A:
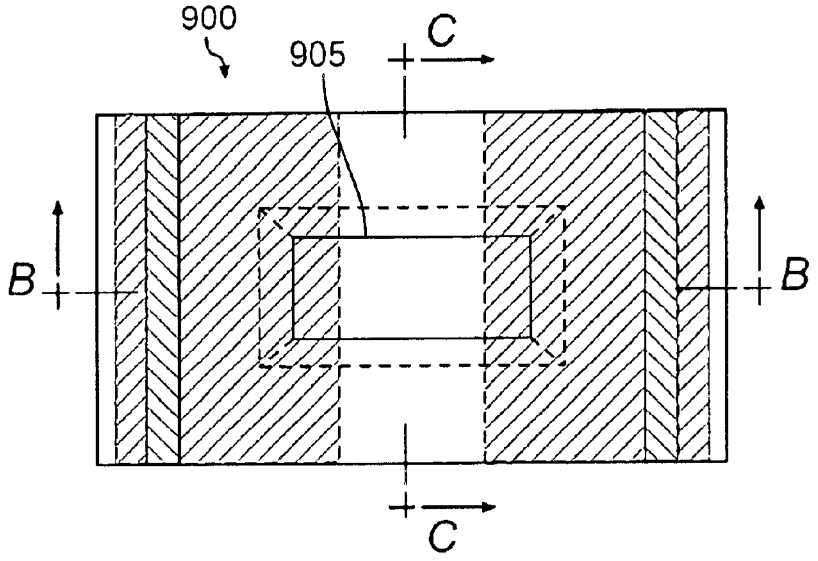
FIGS. 16A to 16C illustrate a cell structure having tilted trench walls according to a fourth embodiment of the present invention.
Figure 16B:
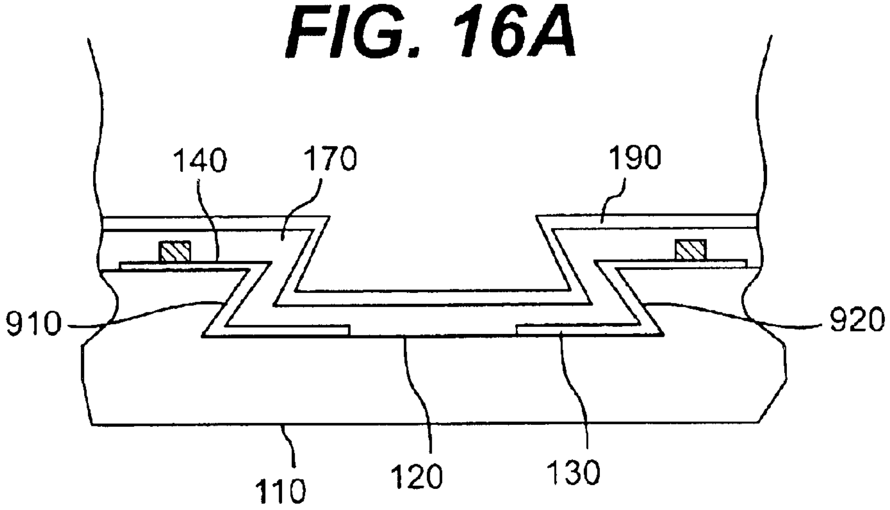
Figure 16C:
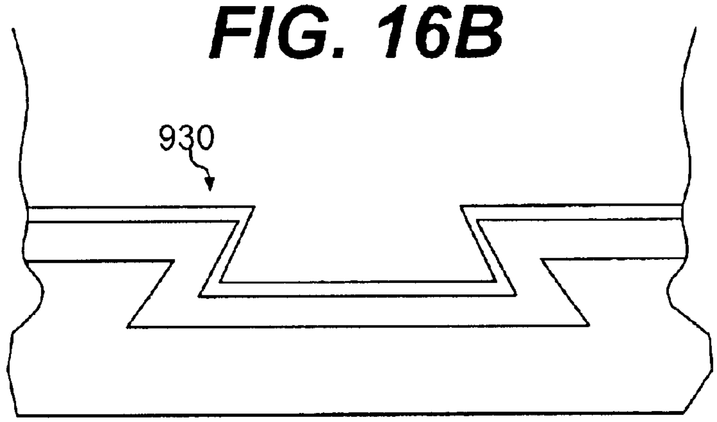

FIGS. 16A to 16C illustrate a cell structure having tilted trench walls according to a fourth embodiment of the present invention. In FIG. 16A, a top view of the cell structure is shown with a trench 905 having tilted walls. In FIG. 16B, a cross-sectional view along line B—B indicates that walls 910 and 920 of the trench 120 cut in a glass substrate 110 are tilted inward towards the center of the trench at a predetermined angle. This also causes electrodes 130 and 140 to be tilted, as well as a dielectric layer 170. The tilt in the wall may be of any angle, and may be greater than 450 from the horizontal direction. FIG. 16C illustrates a cross-section of the cell along line C—C indicating that the walls of the trench are also tilted across this cross-section of the trench.

Figure 17A:
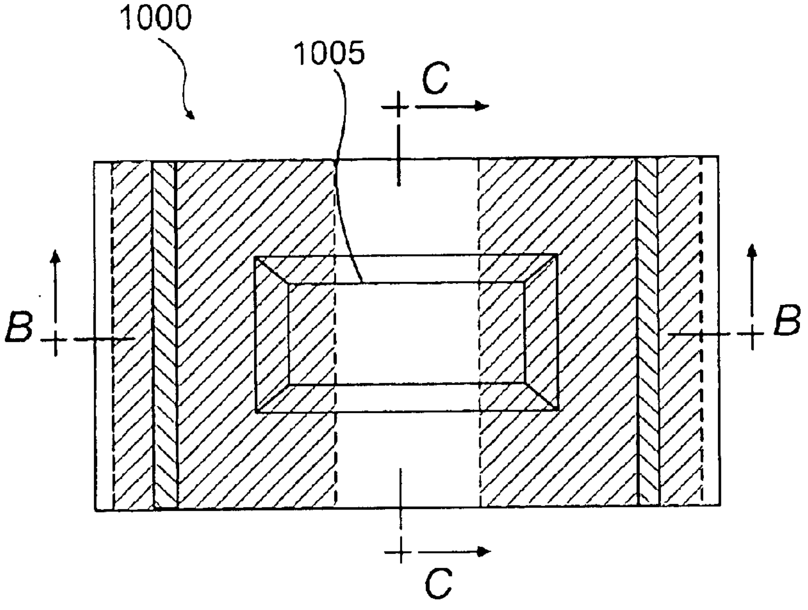
FIGS. 17A to 17C illustrate a cell structure having tilted trench walls according to a fifth embodiment of the present invention.
Figure 17B:
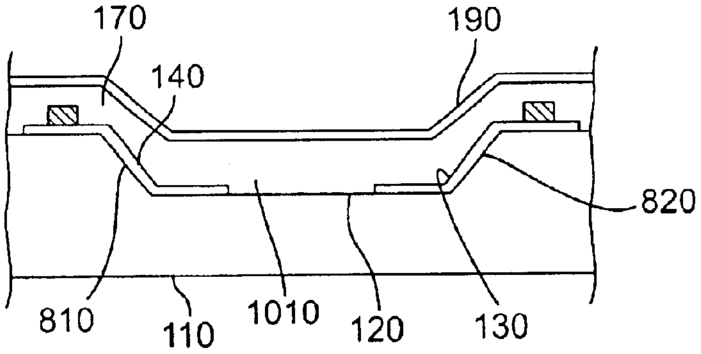
Figure 17C:
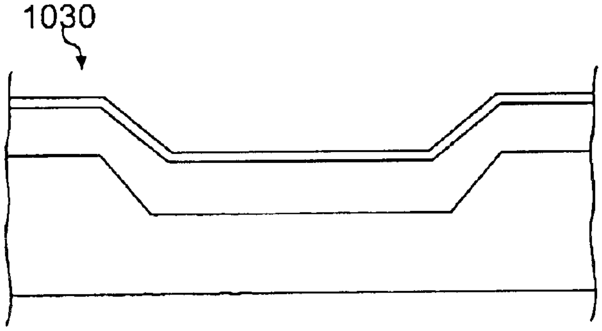

FIGS. 17A to 17C illustrate a cell structure having tilted trench walls according to a fifth embodiment of the present invention. In FIG. 17A, a top view of the cell structure is shown with a trench 1005 having tilted walls. In FIG. 17B, a cross-sectional view taken along line B—B indicates that a dielectric layer 170 is much thicker in the area 1010 near the bottom of the trench than in the area near the walls of the trench. FIG. 17C illustrates a cross-sectional view of the cell along line C—C indicating that the walls of the trench are also tilted across the cross-sectional view of the trench, and the dielectric layer is thicker at the bottom of the trench.

Figure 18A:
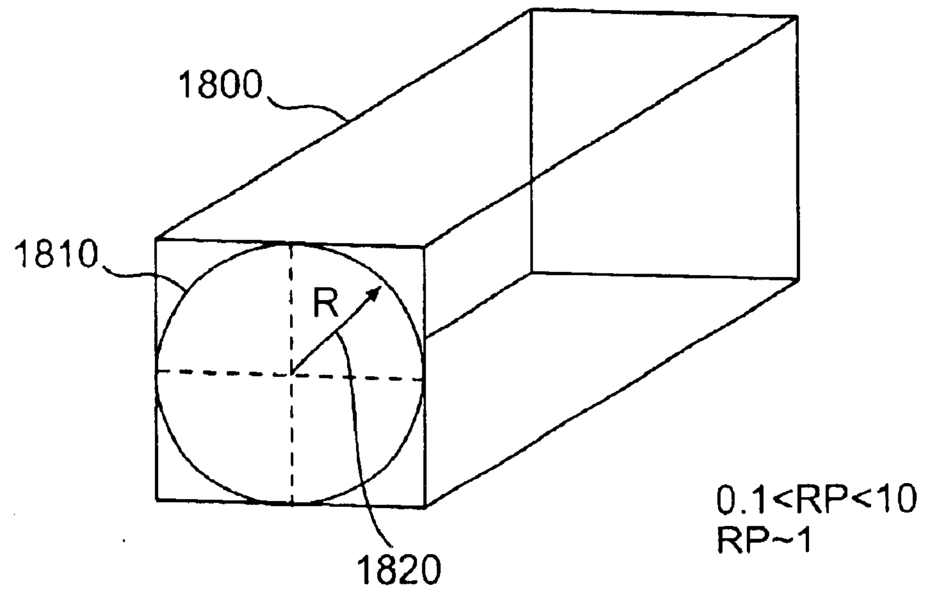
FIG. 18A is a schematic view illustrating a trench volume having one side of the volume approximated as a circle of constant radius R.

FIG. 18A is a schematic view illustrating a trench volume having one side of the volume approximated as a circle of a constant radius R. And, FIG. 18B is a schematic view of a trench volume having one side of the volume approximated as an ellipse with radii r1 and r2.

In FIG. 18A, the volume 1800 created by the trench is depicted with one side of the volume approximated as a circle 1810 of a constant radius R 1820. As has been reported in discharge lamps, the most efficient operation occurs when the product of the lamp radius (R) and the pressure (P) is equal to approximately 1 torr cm. Therefore, the present invention is to optimize the size of the trench such that the product of radius (R) and pressure (P) in the panel is equal to approximately 1 torr cm. For example, a typical pressure used in PDP is about 450 torr. This would require a trench with an equivalent radius R of about 22 microns. For a 42-inch diagonal panel designed for SVGA format, the individual sub pixels are about 360 microns wide. In this case, each sub pixel may have as many as 10 or more trenches depending on how thin the walls can be made between trenches. This size may be changed with the panel size and format of the panel. Since the cell pitch for a given panel depends on the display format and panel size, the range in the cell pitch size in a PDP is several hundred microns. Therefore, the gas pressure and the trench width may be selected such that the product of the pressure and the equivalent radii are between 0.1 and 10 torr cm.

Figure 18B:
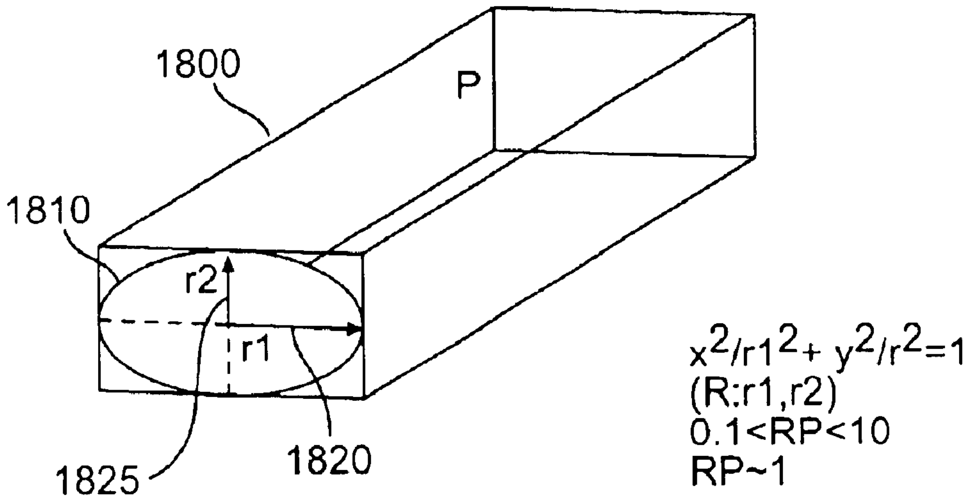
FIG. 18B is a schematic view illustrating a trench volume having one side of the volume approximated as an ellipse with radii r1 and r2.

FIG. 18B is similar to FIG. 18A, except for that the trench volume 1800 has a cross-section which is more closely approximated as an ellipse 1810 with radii r1 1820 and r2 1825. It would be desirable to keep the PR product for the two radii, Pr1 and Pr2 close to a value between 0.1 and 10 torr cm, and preferably close to 1 torr cm.

It will be apparent to those skilled in the art that various modifications and variations can be made in the plasma display panel having a trench discharge cell and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. A plasma display panel having a plurality of trench discharge cells, one or more sustain electrodes, and one or more bus electrodes, comprising:

a transparent substrate having at least one isolated trench in a discharge cell wherein the one or more sustain electrodes are formed in the trench and extended to outside of the trench, wherein the bus electrodes are formed along a first direction on the substrate, and wherein the trench has a first length perpendicular to the first direction and a second length parallel to the first direction, and the first length is greater than the second length.

2. A plasma display panel having a plurality of trench discharge cells, comprising:

a transparent substrate having at least one isolated trench in a discharge cell;

one or more sustain electrodes in each trench and extended to outside of the trench;

one or more bus electrodes on the sustain electrode along a first direction; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, and wherein the trench has a first length perpendicular to the first direction and a second length parallel to the first direction, and the first length is greater than the second length.

3. The plasma display panel of claim 2, wherein the trench has sidewalls substantially perpendicular to the bottom of the trench.

4. The plasma display panel of claim 2, wherein the trench has sidewalls having an angle to the bottom of the trench that is less than 90°.

5. The plasma display panel of claim 2, wherein the trench has sidewalls having an angle to the bottom of the trench that is greater than 90°.

6. The plasma display panel of claim 2, wherein the trench has a shape of one of rectangular, circular, polygonal, oval and dumbbell in plane view.

7. The plasma display panel of claim 2 comprising at least two sustain electrodes, wherein the sustain electrodes at the bottom of the trench are separated from each other by a gap narrow enough to minimize a driving voltage.

8. The plasma display panel of claim 7, wherein the gap between the sustain electrodes is in the range of about 20 and 200 microns.

9. The plasma display panel of claim 8, wherein the sustain electrodes are covered with the dielectric layer having a thickness in the range of about 20 and 200 microns.

10. The plasma display panel of claim 9, wherein a thickness of the first and second portions of the dielectric layer covering the sustain electrodes is substantially the same.

11. The plasma display panel of claim 10, wherein the first and second portions each has a thickness substantially greater than the third portion.

12. The plasma display panel of claim 7, wherein the trench is substantially the same size as the discharge cell.

13. The plasma display panel of claim 12, wherein the sustain electrodes are not formed on the bottom of the trench.

14. The plasma display panel of claim 12, wherein the gap between the sustain electrodes is in the range of about 20 and 200 microns.

15. The plasma display panel of claim 14, wherein the sustain electrodes are covered with the dielectric layer having a thickness in the range of about 20 and 200 microns.

16. The plasma display panel of claim 15, wherein a thickness of the first and second portions of the dielectric layer covering the sustain electrodes is substantially the same.

17. The plasma display panel of claim 16, wherein the first and second portions each has a thickness substantially greater than the third portion.

18. The plasma display panel of claim 2, wherein the sustain electrodes are not formed on the bottom of the trench.

19. The plasma display panel of claim 2, wherein the sustain electrodes are formed to expose at least a portion of the bottom of the trench.

20. The plasma display panel of claim 19, wherein the sustain electrodes have a shape of one of stripe, hammer, and spike shapes in the bottom of the trench.

21. The plasma display panel of claim 19, wherein the sustain electrodes are formed to expose a portion of the sidewalls of the trench.

22. The plasma display panel of claim 2, wherein portions of the dielectric layer act as a barrier rib.

23. The plasma display panel of claim 2, further comprising a pair of barrier ribs on the dielectric layer.

24. The plasma display panel of claim 2, wherein the trench has a bottom shape of one of flat, step, V-, and U-shapes in cross-sectional view.

25. The plasma display panel of claim 2, further comprising a protective layer on the dielectric layer.

26. The plasma display panel of claim 25, wherein the protective layer is formed of magnesium oxide (MgO).

27. The plasma display panel of claim 2, wherein the bus electrodes are formed in a groove of the transparent substrate.

28. The plasma display panel of claim 2, wherein the panel is operated with about a P×R value in the range of about 0.1 and 10, where P is an operation pressure (Torr) and R is a radius (cm) of a maximum sized imaginary cylinder occupied in the trench.

29. The plasma display panel of claim 2, wherein the first portion has a thickness greater than the second and third portions.

30. The plasma display panel of claim 2, wherein the first portion has a thickness that is 1.1 to 4 times thicker than a thickness of the third portion.

31. The plasma display panel of claim 2, wherein the first portion has a thickness that is 1.5 to 2.5 times thicker than a thickness of the third portion.

32. The plasma display panel of claim 2, wherein the trench has a length and width, and the length to width ratio is greater than 1.

33. A plasma panel having a plurality of trench discharge cells, comprising:

a transparent substrate having at least one isolated trench in a discharge cell;

one or more sustain electrodes in each trench and extended to outside of the trench;

one or more bus electrodes on the sustain electrode along a first direction; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, wherein the trench has a first length perpendicular to the first direction and a second length parallel to the first direction, and the first length is substantially greater than the second length to generate a positive column effect in the discharge cell.

34. The plasma display panel of claim 33, wherein the trench has sidewalls substantially perpendicular to the bottom of the trench.

35. The plasma display panel of claim 33, wherein the trench has sidewalls having an angle to the bottom of the trench that is less than 90°.

36. The plasma display panel of claim 33, wherein the trench has sidewalls having an angle of the bottom of the trench that is greater than 90°.

37. The plasma display panel of claim 33, wherein the trench has a shape of one of rectangular, circular, polygonal, oval, and dumbbell in plane view.

38. The plasma display panel of claim 33, comprising at least two sustain electrodes, wherein the sustain electrodes at the bottom of the trench are separated apart from each other by a gap narrow enough to minimize a driving voltage.

39. The plasma display panel of claim 38, wherein the gap between the sustain electrodes is in the range of about 20 and 200 microns.

40. The plasma display panel of claim 39, wherein the sustain electrodes are covered with the dielectric layer having a thickness in the range of 20 and 200 microns.

41. The plasma display panel of claim 40, wherein a thickness of the first and second portions of the dielectric layer covering the sustain electrodes is substantially the same.

42. The plasma display panel of claim 41, wherein the first and second portions each has a thickness substantially greater than the third portion.

43. The plasma display panel of claim 38, wherein the trench is substantially the same size as the discharge cell.

44. The plasma display panel of claim 43, wherein the gap between the sustain electrodes is in the range of about 20 to 200 microns.

45. The plasma display panel of claim 44, wherein the sustain electrodes are covered with the dielectric layer having a thickness in the range of about 20 and 200 microns.

46. The plasma display panel of claim 45, wherein a thickness of the first and second portions of the dielectric layer covering the sustain electrodes is substantially the same.

47. The plasma display panel of claim 46, wherein the first and second portions each has a thickness substantially greater than the third portion.

48. The plasma display panel of claim 43, wherein the sustain electrodes are not formed on the bottom of the trench.

49. The plasma display panel of claim 33, wherein the sustain electrodes are not formed on the bottom of the trench.

50. The plasma display panel of claim 33, wherein the sustain electrodes arc formed to expose at least a portion of the bottom of the trench.

51. The plasma display panel of claim 50, wherein the sustain electrodes have a shape of one of stripe, hammer, and spike shapes in the bottom of the trench.

52. The plasma display panel of claim 50, wherein the sustain electrodes are formed to expose a portion of the sidewalls of the trench.

53. The plasma display panel of claim 33, wherein portions of the dielectric layer act as a barrier rib.

54. The plasma display panel of claim 33, further comprising a pair of barrier ribs on the dielectric layer.

55. The plasma display panel of claim 33, wherein the trench has a bottom shape of one of flat, step, V-, and U-shapes in cross-sectional view.

56. The plasma display panel of claim 33, further comprising a protective layer on the dielectric layer.

57. The plasma display panel of claim 56, wherein the protective layer is formed of magnesium oxide (MgO).

58. The plasma display panel of claim 33, wherein the bus electrodes are formed in a groove of the transparent substrate.

59. The plasma display panel of claim 33, wherein the panel is operated with about P×R value in the range of about 0.1 and 10, where P is an operation pressure (Torr) and R is a radius (cm) of a maximum sized imaginary cylinder occupied in the trench.

60. The plasma display panel of claim 33, wherein the first portion has a thickness greater than the second and third portions.

61. The plasma display panel of claim 33, wherein the first portion has a thickness that is 1.1 to 4 times thicker than a thickness of the third portion.

62. The plasma display panel of claim 33, wherein the first portion has a thickness that is 1.5 to 2.5 times thicker than a thickness of the third portion.

63. The plasma display panel of claim 33, wherein the trench has a length and width, and the length to width ratio is greater than 1.

64. A plasma display panel having a plurality of trench discharge cells, comprising:

a transparent substrate having at least one isolated trench in a discharge cell;

one or more sustain electrodes in each trench and extended to outside of the trench;

one or more bus electrodes on the sustain electrode; and a dielectric layer on an entire surface of the transparent substrate including the sustain electrodes, the bus electrodes, and the trench, wherein the dielectric layer has a first portion on the bottom of the trench, a second portion outside the trench of the substrate, and a third portion on side-walls of the trench, wherein the first portion has a thickness greater than the second and third portions.

65. The plasma display panel of claim 64, wherein the trench has sidewalls substantially perpendicular to the bottom of the trench.

66. The plasma display panel of claim 64, wherein the trench has sidewalls having an angle to the bottom of the trench that is less than 90°.

67. The plasma display panel of claim 64, wherein the trench has sidewalls having an angle to the bottom of the trench that is greater than 90°.

68. The plasma display panel of claim 64, wherein the trench has a shape of one of rectangular, circular, polygonal, oval, and dumbbell in plane view.

69. The plasma display panel of claim 68, wherein the trench is substantially the same size as the discharge cell.

70. The plasma display panel of claim 69, wherein the gap between the sustain electrodes is in the range of about 20 and 200 microns.

71. The plasma display panel of claim 70, wherein the sustain electrodes are covered with the dielectric layer having a thickness in the range of about 20 and 200 microns.

72. The plasma display panel of claim 71, wherein a thickness of the first and second portions of the dielectric layer covering the sustain electrodes is substantially the same.

73. The plasma display panel of claim 72, wherein the first and second portions each has a thickness substantially greater than the third portion.

74. The plasma display panel of claim 69, wherein the sustain electrodes are not formed on the bottom of the trench.

75. The plasma display panel of claim 64 comprising at least two sustain electrodes, wherein the sustain electrodes at the bottom of the trench are separated apart from each other by a gap narrow enough to minimize a driving voltage.

76. The plasma display panel of claim 75, wherein the gap between the sustain electrodes is in the range of about 20 and 200 microns.

77. The plasma display panel of claim 76, wherein the sustain electrodes are covered with the dielectric layer having a thickness in the range of about 20 and 200 microns.

78. The plasma display panel of claim 77, wherein a thickness of the first and second portions of the dielectric layer covering the sustain electrodes is substantially the same.

79. The plasma display panel of claim 78, wherein the first and second portions each has a thickness substantially greater than the third portion.

80. The plasma display panel of claim 64, wherein the sustain electrodes are not formed on the bottom of the trench.

81. The plasma display panel of claim 64, wherein the sustain electrodes are formed to expose at least a portion of the bottom of the trench.

82. The plasma display panel of claim 81, wherein the sustain electrodes have a shape of one of stripe, hammer, and spike shapes in tie bottom of the trench.

83. The plasma display panel of claim 81, wherein the sustain electrodes are formed to expose a portion of the sidewalls of the trench.

84. The plasma display panel of claim 64, wherein portions of the dielectric layer act as a barrier rib.

85. The plasma panel of claim 64, further comprising a pair of barrier ribs on the dielectric layer.

86. The plasma display panel of claim 64, wherein the trench has a bottom shape of one of flat, step, V-, and U-shapes in cross-sectional view.

87. The plasma display panel of claim 64, further comprising a protective layer on the dielectric layer.

88. The plasma display panel of claim 87, wherein the protective layer is formed of magnesium oxide (MgO).

89. The plasma display panel of claim 64, wherein the bus electrodes are formed in a groove of the transparent substrate.

90. The plasma display panel of claim 64, wherein the panel is operated with about a P×R value in the range of about 0.1 and 10, where P is an operation pressure (Torr) and R is a radius (cm) of a maximum sized imaginary cylinder occupied in the trench.

91. The plasma display panel of claim 64, wherein the first portion has a thickness that is 1.1 to 4 times thicker than a thickness of the third portion.

92. The plasma display panel of claim 64, wherein the first portion has a thickness that is 1.5 to 2.5 times thicker than a thickness of the third portion.

93. The plasma display panel of claim 64, wherein the trench has a length and width, and the length to width ratio is greater than 1.

94. A method of fabricating a plasma display panel, comprising:

forming at least one isolated trench in a discharge cell of a transparent substrate;

forming one or more sustain electrodes in the trench and extended to outside of the trench;

forming one or more bus electrodes on the sustain electrodes along a first direction; and forming a dielectric layer on an entire surface of the substrate including the sustain electrodes, the bus electrodes, and the trench, wherein the dielectric layer having a first portion. on the bottom of the trench, a second portion extended to outside of the trench, and a third portion on side-walls of the trench, and wherein the trench has a first length perpendicular to the first direction and the second length parallel to the first direction, and the first length is greater than the second length.

95. The method of claim 94, wherein the trench is formed by one of wet etching, dry etching, laser ablation, sandblasting, molding, and grinding.

96. The method of claim 94, wherein the forming one or more sustain electrodes includes:

forming a transparent conductive layer on an entire surface of the transparent substrate including in the trench; and patterning the transparent conductive layer to form the sustain electrodes.

97. The method of claim 96, wherein the transparent conductive layer is formed of one of indium tin oxide (ITO) and tin oxide ($SnO_2$).

98. The method of claim 96, wherein the transparent conductive layer is formed by one of chemical vapor deposition, dipping, evaporation, and sputtering.

99. The method of claim 96, wherein the transparent conductive layer is patterned by one of laser ablation, wet etching, and dry etching.

100. The method of claim 94, wherein the bus electrodes are formed of one of a conductive paste and a multilayer of Cr/Cu/Cr or Cr/Al.

101. The method of claim 94, wherein the bus electrodes are formed by one of printing, thick film process with photolithography, and thin film process with photolithography.

102. The method of claim 94, wherein the dielectric layer is formed of one of PbO paste and PbO green sheet.

103. The method of claim 94, wherein the dielectric layer is formed of one of printing, laminating, and dipping.

104. The method of claim 94, further comprising forming a protective layer on the dielectric layer.

105. The method of claim 104, wherein the protective layer is formed of magnesium oxide (MgO).

106. The method of claim 94, further comprising forming a groove in the transparent substrate to form the bus electrodes therein.

107. A method of fabricating a plasma display panel, comprising:

forming at least one groove in a transparent substrate;

forming one or more sustain electrodes in the groove and extended to outside of the groove;

forming one or more bus electrodes on the sustain electrodes;

forming a first dielectric layer on an entire surface of the substrate rate including the sustain electrodes, the bus electrodes, and the trench, wherein the first dielectric layer has a first portion on the bottom of the groove and a second portion outside the groove, and a third portion on side-walls of the trench; and forming a plurality of partitions in the groove to form at least one isolated trench in the transparent substrate.

108. The method of claim 107, further comprising forming a protective layer on the first dielectric layer including the partitions.

109. The method of claim 108, wherein the protective layer is formed of magnesium oxide (MgO).

110. The method of claim 107, wherein the partitions are formed of a dielectric material.

111. The method of claim 107, wherein the forming a plurality of partitions in the groove includes:

forming a second dielectric layer in the groove; and selectively removing the second dielectric layer to form a plurality of the partitions.

112. The method of claim 111, wherein the second dielectric layer is selectively removed by thick film photolithography.

113. The method of claim 107, further comprising forming a groove in the transparent substrate to form the bus electrodes therein.

114. A method of fabricating a plasma display panel, comprising:

forming one or more grooves in a first substrate;

forming one or more sustain electrodes in the grooves and extended to an outside of the groove;

forming one or more bus electrodes on the sustain electrodes along a first direction;

forming a first dielectric layer on an entire surface of the substrate including the sustain electrodes, the bus electrodes, and the grooves, wherein the first dielectric layer having a first portion on the bottom of the grooves, a second portion outside the grooves, and a third portion on side-walls of the grooves and wherein the grooves each has a first length perpendicular to the first direction and a second length parallel to the first direction wherein the first length is greater than the second length;

forming an address electrode on a second substrate;

forming a second dielectric layer on the address electrode including the second substrate; and forming a plurality of protrusions on the second substrate to form at least one isolated trench between the first and second substrates.

115. The method of claim 114, wherein the protrusions are formed of a dielectric material.

116. The method of claim 114, further comprising partially removing the second substrate to form a pair of barrier ribs prior to the forming an address electrode on a second substrate.

117. The method of claim 116, wherein the barrier ribs provide locations for forming the protrusions thereon.

118. The method of claim 114, further comprising forming a pair of barrier ribs on the second dielectric layer.

119. The method of claim 118, wherein the barrier ribs provide locations for forming the protrusions thereon.

120. The method of claim 114, further comprising forming one or more grooves in the transparent substrate to form the bus electrodes therein.

* * * * *